US006810340B2

(12) United States Patent
Shimazaki et al.

(10) Patent No.: US 6,810,340 B2
(45) Date of Patent: Oct. 26, 2004

(54) ELECTROMAGNETIC DISTURBANCE ANALYSIS METHOD AND APPARATUS AND SEMICONDUCTOR DEVICE MANUFACTURING METHOD USING THE METHOD

(75) Inventors: Kenji Shimazaki, Kobe (JP); Shouzou Hirano, Ibaraki (JP); Ritsuko Kurazono, Takatsuki (JP); Masanori Tsutsumi, Kyoto (JP); Kaori Matsui, Kyoto (JP); Hisato Yoshida, Kashihara (JP); Hiroyuki Tsujikawa, Kusatsu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 252 days.

(21) Appl. No.: 10/092,737

(22) Filed: Mar. 8, 2002

(65) Prior Publication Data

US 2002/0147553 A1 Oct. 10, 2002

(30) Foreign Application Priority Data

Mar. 8, 2001  (JP) ..................................... P.2001-065105

(51) Int. Cl.$^7$ ............................................. G06F 19/00
(52) U.S. Cl. ......................................... 702/65; 703/16
(58) Field of Search .............................. 702/65; 703/16, 703/17, 20; 324/158.1; 716/5, 14

(56) References Cited

U.S. PATENT DOCUMENTS 5,436,559 A * 7/1995 Takagi et al. ............. 324/158.1
5,970,429 A * 10/1999 Martin ......................... 702/65

FOREIGN PATENT DOCUMENTS

JP           6-243193         9/1994

* cited by examiner

Primary Examiner—John E. Barlow
Assistant Examiner—Victor J Taylor
(74) Attorney, Agent, or Firm—McDermott Will & Emery LLP

(57) ABSTRACT

An electromagnetic disturbance analysis method for analyzing an external noise to a semiconductor integrated circuit includes an impedance extraction step of extracting impedance information on the power wiring in the target semiconductor integrated circuit or the power wiring in the semiconductor integrated circuit and the external power wiring of the semiconductor integrated circuit, an equivalent circuit creating step of creating an equivalent circuit from the impedance information, and an analysis step of supplying a noise waveform externally and analyzing the influence of the noise on the semiconductor integrated circuit.

58 Claims, 25 Drawing Sheets

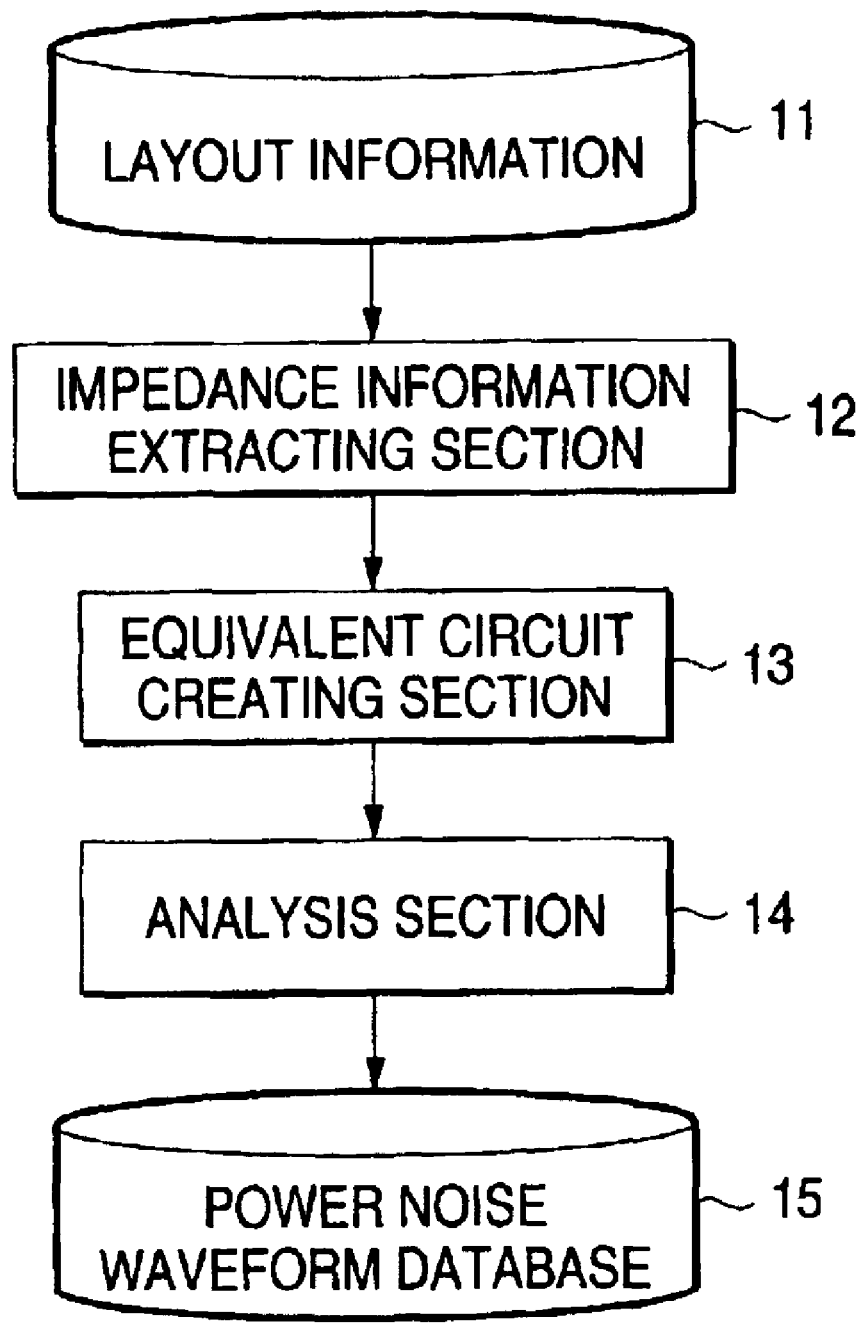

| CELL NAME | PEAK VALUE | DELAY VARIATION AMOUNT PER POWER NOISE INPUT TIMING | | | | |
|---|---|---|---|---|---|---|
| | | -20 | -10 | 0 | +10 | +20 |
| NAND1 | 10 | 0 | -3 | -5 | -3 | 0 |
| NAND1 | 5 | 0 | -1 | -3 | -1 | 0 |
| NAND1 | -5 | 0 | +1 | +3 | +1 | 0 |
| NAND1 | -10 | 0 | +3 | +5 | +3 | 0 |
| ⋮ | ⋮ | ⋮ | ⋮ | ⋮ | ⋮ | ⋮ |

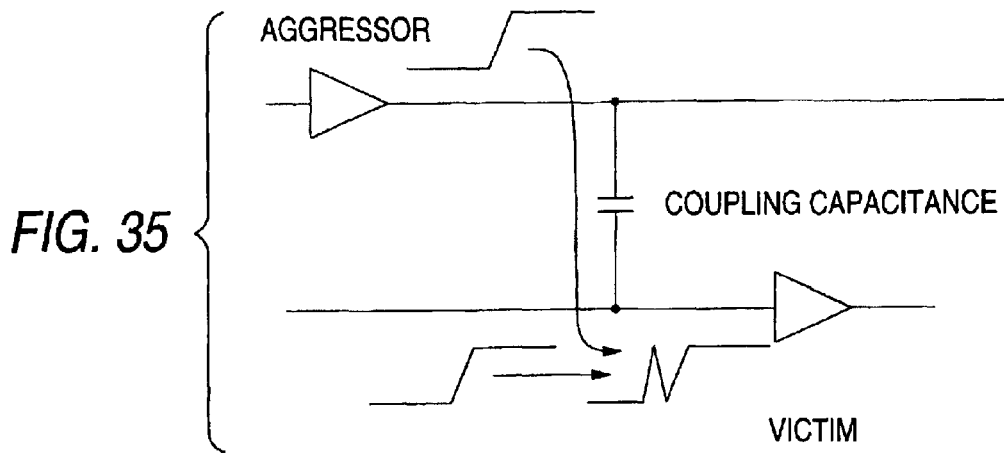
FIG. 35
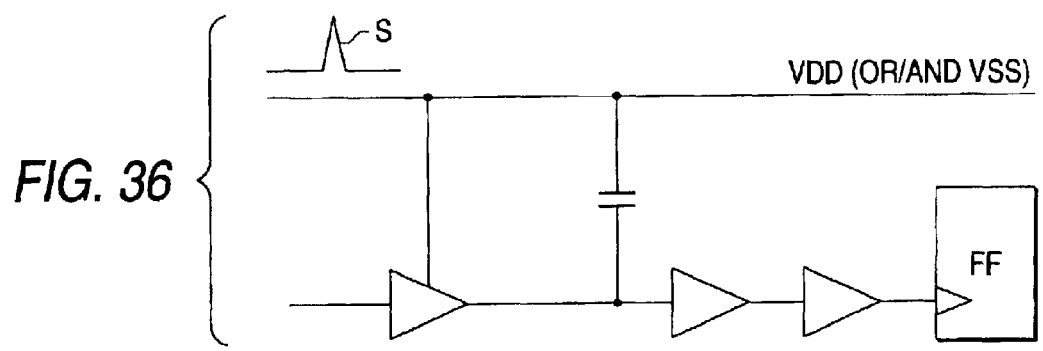
FIG. 36
FIG. 37
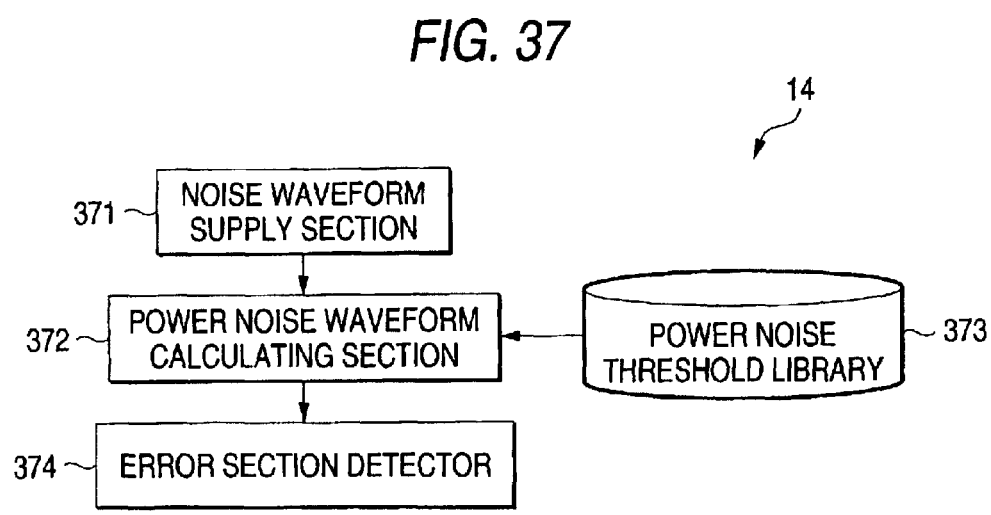

ELECTROMAGNETIC DISTURBANCE ANALYSIS METHOD AND APPARATUS AND SEMICONDUCTOR DEVICE MANUFACTURING METHOD USING THE METHOD

BACKGROUND OF THE INVENTION

The present invention relates to an EMS (Electromagnetic susceptibility) analysis method and EMS analysis apparatus and a method for manufacturing semiconductor devices using the EMS analysis apparatus, and in particular to a method for performing high-speed and high-accuracy EMS analysis on an LSI (Large-scale Integration) circuit featuring large-scale integration and high-speed driving to analyze direct EMS caused by electromagnetic radiation and indirect EMS caused by a power source.

As semiconductor integrated circuits have become faster and achieve larger packing densities, EMS (Electromagnetic susceptibility) has become a serious problem where semiconductor integrated circuits malfunction due to external noises.

One of the possible causes of EMS is that a noise external to a semiconductor integrated circuit entering a power line is propagated inside the semiconductor integrated circuit, affecting signal lines and functional elements, thus causing malfunction of the circuit. Conventionally, tests have been conducted in the design stage to simulate a noise in the signal line of a semiconductor integrated circuit by using a circuit simulator or a faster delay simulator and to check whether such a noise could cause malfunction of the circuit, in order to analyze malfunction caused by a noise entering the semiconductor integrated circuit.

Methods for analyzing a noise other than the EMS noise includes a method for analyzing a crosstalk noise between signal wires in an LSI circuit. As an example of such a method, a method is proposed for analyzing a noise propagated to the circuit elements of the victim caused by a variation in the signal output from the circuit elements of the aggressor due to a coupling capacitance between parallel signal lines thereby analyzing a noise between signal wires, as shown in FIG. 35 (Japanese Patent Publication No. Hei. 6-243193). This technology does not consider the influence that occurs between a power line and a signal line so that it is impossible to analyze the EMS noise.

As shown in FIG. 36, it is possible to input a signal S containing a noise to a power source by using a transistor level simulator such as SPICE. However, in order to locate a disturbance leading to malfunction, it is necessary to perform a large number of test patterns, check the output signals at the circuit elements (gates) and conforming that values different from the expected ones are obtained.

That is, it is necessary to provide test probes for all the cells in order to locate the disturbance. This work is quite difficult in the case of an LSI circuit.

Even when the disturbance is located, which gate must be modified is unknown.

To accurately locate the disturbance, it is necessary to place the LSI circuit in the operating state while using a large number of test vectors.

The aforementioned related art requires huge simulation time for an LSI circuit. The technology considers the case where a noise is generated in a signal line due to a variation in a signal caused by circuit elements in the circuit, or a crosstalk noise, but not the case where a noise is generated in a power line, that is, the influence of indirect EMS on the interior of a semiconductor integrated circuit, or where a noise is generated inside a semiconductor integrated circuit caused by electromagnetic radiation, that is, direct EMS. It is difficult to analyze how the EMS affects a semiconductor integrated circuit and how a circuit is to be modified to cope with the EMS.

As the circuit scale becomes larger, the semiconductor integrated circuit is facing a serious problem of malfunction due to an external power noise (indirect EMS) or a radiation noise due to electromagnetic waves (direct EMS). Conventionally, a method has been employed for evaluating the resistance of a semiconductor integrated circuit to an external noise by providing the semiconductor integrated circuit with a power noise or external strong electromagnetic waves after the semiconductor integrated circuit is manufactured, in order to check the resistance of a semiconductor integrated circuit to an external noise. In case the semiconductor integrated circuit is less resistant to a noise, a de-coupling capacitor is inserted in the semiconductor integrated circuit or the circuit is modified to improve the resistance to a noise.

In this way, inspection on the resistance of a semiconductor integrated circuit to an external noise is performed after the circuit is manufactured. In case any problem occurs concerning an external noise during inspection, the entire semiconductor integrated circuit requires modification. This increases the design period.

SUMMARY OF THE INVENTION

The invention has been proposed in view of the foregoing situation and relates to a method for reducing electromagnetic wave disturbance while maintaining the high integration density and high-speed characteristics of an LSI circuit.

The invention aims at preventing malfunction caused by indirect EMS where an external noise enters the power source and malfunction caused by direct EMS caused by electromagnetic wave radiation as well as readily provide the layout of a reliable semiconductor integrated circuit device.

The invention aims at providing a method for readily identify the location in the design stage where circuit malfunction could be potentially caused by a noise, by obtaining the propagation of a noise waveform in a large-scale semiconductor integrated circuit.

Further, the invention aims at enhancing the resistance of a semiconductor integrated circuit to a noise before manufacturing the circuit by simulating the verification of circuit operation against a power noise.

In order to attain the foregoing object, a method for analyzing an external noise to a semiconductor integrated circuit according to the invention is characterized in that the method comprises an impedance extraction step of extracting impedance information on the power wiring in the target semiconductor integrated circuit or the power wiring in the semiconductor integrated circuit and the external power wiring of the semiconductor integrated circuit, an equivalent circuit creating step of creating an equivalent circuit from the impedance information, and an analysis step of supplying a noise waveform externally and analyzing the influence of the noise on the semiconductor integrated circuit.

According to such steps, an equivalent circuit is created from impedance information, a noise waveform is externally supplied to the equivalent circuit and the influence of the noise on the semiconductor integrated circuit is analyzed. It is thus possible to readily take high-accuracy EMS countermeasures.

The second aspect of the invention is characterized in that the analysis step includes a noise waveform supplying step of supplying a start point power noise waveform, a power noise waveform calculating step of obtaining power noise waveforms at the internal node points and terminals in the semiconductor integrated circuit, and an error section detecting step of obtaining the influence of an external noise on the semiconductor integrated circuit and detecting sections susceptible to an external noise entering the semiconductor integrated circuit.

With this configuration, it is possible to readily detect the sections susceptible to an external noise thus readily taking high-accuracy EMS countermeasures The third aspect of the invention is characterized in that the equivalent circuit creating step comprises a functional block power equivalent circuit creating step of creating a degenerate impedance circuit of each functional block in a semiconductor integrated circuit from the impedance information and an inter-block power equivalent circuit creating step of creating a circuit for analyzing the inter-block power wiring in the semiconductor integrated circuit from the impedance information and that the analysis step uses as the equivalent circuit at least one of the degenerate impedance circuit and the circuit for analyzing the inter-block power wiring.

The fourth aspect of the invention is characterized in that the equivalent circuit creating step comprises a functional block power equivalent circuit creating step of creating a degenerate impedance circuit of each functional block in a semiconductor integrated circuit from the impedance information, an inter-block power equivalent circuit creating step of creating a circuit for analyzing the inter-block power wiring in the semiconductor integrated circuit from the impedance information and an external power equivalent circuit creating step of creating an a circuit for analyzing the power wiring external to the semiconductor integrated circuit from the impedance information, and that the analysis step uses as the equivalent circuit at least one of the degenerate impedance circuit, the circuit for analyzing the inter-block power wiring and the circuit for analyzing the power wiring external to the semiconductor integrated circuit.

According to the third and fourth aspects, it is readily possible to identify the sections susceptible to EMS by inputting a power noise waveform to the power line external to a semiconductor integrated circuit, analyzing the propagation of the power noise waveform through simulation, and obtaining a power waveform at each point in the semiconductor integrated circuit.

The fifth aspect of the invention is characterized in that the inter-block power equivalent circuit creating step is a step of creating the circuit for analyzing the inter-block power wiring by adding the impedance information on the inter-block power wiring to the degenerate impedance circuit created by the functional block power equivalent circuit creating step and that the analysis step uses as the equivalent circuit at least one of the degenerate impedance circuit and the circuit for analyzing the inter-block power wiring.

The sixth aspect of the invention is characterized in that the inter-block power equivalent circuit creating step is a step of creating the circuit for analyzing the inter-block power wiring by adding the impedance information on the inter-block power wiring to the degenerate impedance circuit created by the functional block power equivalent circuit creating step, that the external power equivalent circuit creating step is a step of configuring a circuit for analyzing the power wiring external to the semiconductor integrated circuit by creating a degenerate impedance circuit in the circuit for analyzing the inter-block power wiring and adding the impedance information external to the semiconductor integrated circuit to the degenerate impedance circuit, and that the analysis step uses as the equivalent circuit at least one of the degenerate impedance circuit, the circuit for analyzing the inter-block power wiring and the circuit for analyzing the power wiring external to the semiconductor integrated circuit.

According to the fifth and sixth aspects, a degenerate impedance circuit is used on top of the advantages of the third and fourth aspects. This simplifies the arithmetic operation and readily provides a reliable analysis. The seventh aspect of the invention is characterized in that the noise waveform supplying step is a step of supplying a start point power noise waveform to the power terminal in a circuit for analyzing the inter-block power wiring created from the impedance information and that the power noise waveform calculating step includes an inter-block power noise calculating step of obtaining an inter-block power noise waveform at each internal node point in the circuit for analyzing the inter-block power wiring as well as obtaining a block terminal power noise waveform at a terminal in each functional block and an intra-functional-block power noise waveform calculating step of obtaining a functional block power noise waveform at each node point in the functional block as well as obtaining an element terminal power noise waveform at the power terminal in each element by providing as input the block terminal power noise waveform to the impedance circuit in the functional block created from the impedance information, and identifies the circuit section expected to be susceptible to an external noise by using at least one of the block terminal power noise waveform, the inter-block power noise waveform, the functional block power noise waveform and the element terminal power noise waveform.

The eighth aspect of the invention is characterized in that the noise waveform supplying step is a step of supplying a start point power noise waveform to the power terminal in a circuit for analyzing the power wiring external to the semiconductor integrated circuit created from the impedance information and that the power noise waveform calculating step includes external power noise waveform calculating step of obtaining a terminal power noise waveform at the power terminal in a circuit for analyzing the inter-block power wiring created from the impedance information through the circuit for analyzing the power wiring external to the semiconductor integrated circuit, an inter-block power noise calculating step of obtaining an inter-block power noise waveform at each internal node point of the inter-block power wiring as well as obtaining a block terminal power noise waveform at a terminal in each functional block and an intra-functional-block power noise waveform calculating step of obtaining a functional block power noise waveform at each node point in the functional block as well as obtaining an element terminal power noise waveform at the power terminal of each element by providing as input the block terminal power noise waveform to the impedance circuit in the functional block, and identifies the circuit section expected to be susceptible to an external noise by using at least one of the terminal power noise waveform, the block terminal power noise waveform, the inter-block power noise waveform, the functional block power noise waveform and the element terminal power noise waveform.

With this configuration, it is possible to analyze a large-scale semiconductor integrated circuit by creating impedance models of the power wiring external to the semiconductor integrated circuit, inter-block power wiring in a semiconductor integrated circuit and block wiring in a semiconductor integrated circuit separately, and obtaining power noise waveforms in a layered step.

The ninth aspect of the invention is characterized in that the error section detecting step comprises an error check step of identifying the circuit sections that will cause an error due to an external noise by providing a power noise peak threshold for the power noise waveform and assuming an error when the threshold is exceeded thus performing an error check.

With this configuration, an error check is made in accordance with a predetermined threshold so that it is possible to effectively identify the circuit sections that will cause an error.

The tenth aspect of the invention is characterized in that the error section detecting step performs a noise check step of performing a noise check by providing a threshold at the power terminal in the circuit for analyzing the inter-block power wiring and assuming an error when the threshold is exceeded and performs the inter-block power noise waveform calculating step only when an error is determined.

With this configuration, the inter-block power noise waveform calculating step is performed only when an error is determined assuming that the threshold at the power terminal in the circuit for analyzing the inter-block power wiring is exceeded. This includes no useless steps and allows an efficient check.

The eleventh aspect of the invention is characterized in that the threshold at the power terminal in the circuit for analyzing the inter-block power wiring is the maximum among the thresholds for the terminal in the functional block in the semiconductor integrated circuit and inter-block power wiring.

With this configuration, the threshold at the power terminal in the circuit for analyzing the inter-block power wiring is set to the maximum among the thresholds for the terminal in the functional block in the semiconductor integrated circuit and inter-block power wiring. This prevents useless calculation and allows an efficient check.

The twelfth aspect of the invention is characterized in that the error section detecting step performs a noise check step of performing a noise check by providing a peak threshold for a power noise at each functional block in a semiconductor integrated circuit and assuming an error when the threshold is exceeded at the power terminal in the functional block and performs the intra-functional-block power noise waveform calculating step only when an error is determined.

With this configuration, the intra-block power noise waveform calculating step is performed only when an error is determined assuming that the threshold for a noise power peak for each functional block is exceeded. This includes no useless steps and allows an efficient check.

The thirteenth aspect of the invention is characterized in that the threshold for a power noise at the power terminal in each functional block is the maximum of the thresholds for the functional elements in each functional block and power wiring.

With this configuration, the threshold at the power terminal in the circuit for analyzing the inter-block power wiring is set to the maximum among the thresholds for the functional element in the semiconductor integrated circuit, the functional element in the functional block, and the power wiring. This prevents useless calculation and allows an efficient check.

The fourteenth aspect of the invention is characterized in that the error check step comprises a noise check step of performing a noise check by providing a peak threshold for a power noise at each functional element in a semiconductor integrated circuit and assuming an error when the power noise peak value has exceeded the threshold.

With this configuration, an error check is made in accordance with a predetermined threshold so that it is possible to effectively identify the circuit sections that will cause an error.

The fifteenth aspect of the invention is characterized in that the error check step comprises a noise check step of performing a noise check by providing a peak threshold for a power noise determined by the distance to an adjacent signal line and length of parallel wiring for the power wiring in each functional block or inter-block power wiring and assuming an error when the power noise peak value has exceeded the threshold at each internal node points of the power wiring.

With this configuration, the intra-block power noise waveform calculating step is performed only when an error is determined assuming that threshold for a noise power peak for the power wiring in each functional block or inter-block power wiring is exceeded. This includes no useless steps and allows an efficient check.

The sixteenth aspect of the invention is analysis apparatus, characterized in that the apparatus comprises extraction means for extracting impedance information on the power wiring in the target semiconductor integrated circuit or the power wiring in the semiconductor integrated circuit and the external power wiring of the semiconductor integrated circuit, equivalent circuit creating means for creating an equivalent circuit from the impedance information, and analysis means for supplying a noise waveform externally and analyzing the influence of the noise on the semiconductor integrated circuit.

With this configuration, an equivalent circuit is created from impedance information, a noise waveform is externally supplied to the equivalent circuit and the influence of the noise on the semiconductor integrated circuit is analyzed. It is thus possible to readily take high-accuracy EMS countermeasures.

The seventeenth aspect of the invention is characterized in that the analysis step comprises a step of obtaining a power waveform at the power terminal of each circuit element in the semiconductor integrated circuit, a calculating step of calculating the delay time of the circuit element based on the power waveform at the power terminal of the circuit element, and a timing verification step of determining whether the delay time of the circuit element is within an allowable range.

With this configuration, timing verification is made based on the calculated delay time in accordance with the power waveform at the power terminal of each circuit element. It is thus possible to readily perform high-accuracy verification.

The eighteenth aspect of the invention is characterized in that the analysis step comprises a step of obtaining a power waveform at the power terminal of each circuit element in the semiconductor integrated circuit, a calculating step of calculating the delay time of the circuit element based on the power waveform at the power terminal of the circuit element, and a timing verification step of determining whether the sum of the delay times of the series of circuit elements is within an allowable range.

With this configuration, it is possible to perform high-accuracy verification, on top of the advantage of the seventeenth aspect.

The nineteenth aspect of the invention is characterized in that the analysis step comprises a database creating step of calculating the variation amount in the delay time of a circuit element obtained when at least one of the input timing and peak value of the noise waveform of the power terminal is varied and creating a delay variation amount database based on the calculation result, and that the calculating step comprises a step of obtaining the variation amount of the delay time of the circuit element with respect to a desired noise waveform from the delay variation amount database.

The twentieth aspect of the invention is characterized in that the analysis step comprises a database creating step of calculating the variation amount in the delay time of a circuit element obtained when at least one of the input timing and peak value of the noise waveform of the power terminal is varied and creating a delay variation rate database by obtaining the calculation result as a rate to the delay time of the circuit element observed when no power noises are present, and that the calculating step comprises a step of obtaining the delay variation amount of the circuit element with respect to a desired noise, by multiplying the delay time of the circuit element observed when no power noises are present by the rate read from the delay variation rate database.

The twenty-first aspect of the invention is characterized in that the analysis step comprises a step of obtaining the delay variation amount of the series of circuit elements with the timing the power noise where the variation amount of each circuit element is the maximum is input to the series of circuit element, as the maximum delay amount of the series of circuit elements.

The twenty-second aspect of the invention is characterized in that the analysis step comprises a step of detecting a circuit section where a signal does not arrive within a time required for circuit operation due to a variation in the delay time of a circuit element caused by a power noise thus resulting in an unexpected circuit operation.

The twenty-third aspect of the invention is characterized by further comprising an error element detecting step of exploring a circuit element whose delay time is most affected by a power noise from the detected circuit section and detecting the circuit element as an error element.

The twenty-fourth aspect of the invention is characterized by further comprising are in forcing step of taking power noise hardening countermeasures on the error element.

The twenty-fifth aspect of the invention is characterized by further comprising a replacing step of replacing the circuit element assumed as an error element in the error element detecting step with a circuit element whose delay variation amount with respect to a power noise is smaller.

The twenty-sixth aspect of the invention is characterized by further comprising a replacing step of replacing the circuit element assumed as an error element in the error element detecting step with a circuit element which satisfies a constraint time.

The twenty-seventh aspect of the invention is characterized by further comprising a step of manufacturing a semiconductor device through error-free layout design based on the analysis result using an electromagnetic disturbance analysis method according any one of the first to twenty-sixth aspects.

With these configurations, the signal waveform at the power terminal of each circuit element in a semiconductor integrated circuit is obtained, then the input timing and peak value of a power noise at the power terminal of each circuit element in the semiconductor integrated circuit are obtained.

A database may be created by simulation which calculates the variation amount of the delay time of the circuit element when the input timing and peak value of the power noise is varied. Based on the noise waveform at the power terminal of each circuit element and on the database of the delay time variation amount, the variation amount of the delay time of a circuit element may be calculated. Further, a circuit section, where a signal does not arrive within a time required for circuit operation due to a variation at the delay time of a circuit element caused by providing an arbitrary power noise thus resulting in an unexpected circuit operation, maybe detected. Noise tolerance maybe improved by changing a circuit element in order to satisfy the constraint time in the circuit section where an unexpected circuit operation occurs in case an arbitrary power noise is provided.

The twenty-eighth aspect of the invention is a method for analyzing an electromagnetic disturbance in an LSI circuit, characterized in that the method comprises a library storage step of calculating the noise threshold for changing the output result or internal state caused by a power noise and storing the noise threshold into a library and an analysis step of analyzing whether each of the circuit elements in the LSI circuit suffer from the influence of the power noise while referring to the library.

With this configuration, analysis is readily made with efficiency by storing the threshold into a library.

The twenty-ninth aspect of the invention is characterized in that the library storage step comprises a step of storing into a library any of the peak, width and shape functions or values of the voltage or current waveform that can pass through a circuit element.

The thirtieth aspect of the invention is characterized in that the library storage step comprises a step of storing into the library a noise threshold for a path on which a noise is input to the terminal of a circuit element and is output from the terminal of the circuit element or a path for changing the internal state.

With the configurations of the twenty-ninth and thirtieth aspects, it is possible to perform more efficient analysis.

The thirty-first aspect of the invention is characterized in that the analysis step comprises a step of analyzing a path to be input to the terminal of a circuit element and output from the terminal of the circuit element or to change the internal state.

The thirty-second aspect of the invention is characterized in that the analysis step comprises a recording step of recording path information.

The thirty-third aspect of the invention is characterized in that the recording step comprises a step of recording a circuit element where a noise is propagated.

The thirty-fourth aspect of the invention is characterized in that the recording step comprises a step of recording a register element where a noise is propagated.

The thirty-fifth aspect of the invention is characterized in that the recording step comprises a step of recording a damage that results when a circuit element where a noise is propagated is virtually changed to a circuit element with different drive capability.

The thirty-sixth aspect of the invention is characterized in that the recording step comprises a step of recording a circuit element susceptible to a noise on the path.

The thirty-seventh aspect of the invention is characterized in that the analysis step comprises a step of calculating the power noise by analyzing electromagnetic wave.

The thirty-eighth aspect of the invention is characterized in that the analysis step comprises a step of recording a circuit element susceptible to a noise on the path entering a specified circuit element.

The thirty-ninth aspect of the invention is characterized in that the analysis step comprises a step of recording a circuit element susceptible to a noise on the path entering a register element.

With the configurations of the thirty-first through thirty-ninth aspects, efficiency of counter measure processing is considerably improved by detecting and recording a section susceptible to an electromagnetic disturbance more easily.

The fortieth aspect of the invention is analysis apparatus for analyzing an electromagnetic disturbance in an LSI circuit, characterized in that the apparatus comprises a library storage step of calculating the noise threshold for changing the output result or internal state depending on a power noise and storing the noise threshold into a library, and an analysis step of analyzing whether each of the circuit elements in the LSI circuit suffer from the influence of the power noise while referring to the library.

With this configuration, analysis is readily made with efficiency by storing the threshold into a library.

The forty-first aspect of the invention is characterized by comprising a step of analyzing an electromagnetic disturbance in an LSI circuit, a sorting step of sorting blocks or instances that need countermeasures and a countermeasure step of taking countermeasures to erase a power noise on each block or instance.

With this configuration, blocks or instances that need countermeasures are sorted so that it is possible to efficiently take countermeasures in this order.

The forty-second aspect of the invention comprises a step of analyzing EMS of the block or instance after the countermeasure step, characterized in that the countermeasure step and analysis step are repeated until the influence of the power noise is found below a predetermined value in the analysis step.

With this configuration, the countermeasure step and analysis step are repeated until the influence of the power noise is found below a predetermined value in the analysis step so that it is possible to take reliable countermeasures efficiently.

The forty-third aspect of the invention is characterized in that the countermeasure step is a step of inserting a delay adjustment element for performing delay adjustment so that a switching element will become highly resistant with the timing a current including a noise enters the switching element and an RC filter circuit formed by the switching element and a capacitance element.

With this configuration, it is possible to perform removal of noise only through adjustment of a switching element and a capacitance element to be inserted.

The forty-fourth aspect of the invention is characterized in that the countermeasure step is a step of inserting an inductor.

The forty-fifth aspect of the invention is characterized in that the countermeasure step is a step of adjusting the power wiring length distance.

The forty-sixth aspect of the invention is characterized in that the countermeasure step is a step of changing the cell rank so that the drive capability of the cell with sufficient timing will be reduced.

With the foregoing configurations, it is possible to efficiently perform removal of noise.

The forty-seventh aspect of the invention is characterized by comprising means for analyzing an electromagnetic disturbance in an LSI circuit, sorting means for sorting blocks or instances that need countermeasures and countermeasure means for taking countermeasures to erase a power noise on each block or instance in accordance with the order arranged by the sorting means.

With this configuration, blocks or instances that need countermeasures are sorted so that it is possible to efficiently take countermeasures in this order.

The forty-eighth aspect of the invention comprises means for analyzing EMS of the block or instance that undertook countermeasures in the countermeasure means, characterized in that the countermeasure step and analysis step are repeated until the influence of the power noise is found below a predetermined value in the analysis step.

With this configuration, the countermeasure step and analysis step are repeated until the influence of the power noise is found below a predetermined value in the analysis means, so that it is possible to perform efficient and reliable processing. With this configuration, it is possible to detect an increase in the power consumption observed when for example a buffer is replaced with one having larger drive capability.

The forty-ninth aspect of the invention is characterized by comprising a display step of highlighting cells susceptible to a noise and paths connecting the cells as analyzed in the analysis step.

The fiftieth aspect of the invention is characterized by comprising a display step of highlighting register cells such as memory cells.

The fifty-first aspect of the invention is characterized by comprising a display step of displaying information on cells that were found susceptible to a noise and should be replaced in the analysis step.

The fifty-second aspect of the invention is characterized by comprising a virtual display step of displaying parameters renewed for each cell virtually changed based on the information on cells that were analyzed to be replaced with spare in the analysis step.

The fifty-third aspect of the invention is characterized by comprising a sorting step of sorting blocks or instances determined requiring countermeasures in the analysis step.

The fifty-fourth aspect of the invention is characterized by comprising a countermeasure sorting step of sorting countermeasures to take on blocks or instances determined to require countermeasures in the analysis step.

With the configurations of the forty-ninth through fifty-fourth aspects, EMS analysis and corresponding countermeasures take place. It is possible to sequentially display the steps and display which countermeasures are to be taken on which objects and resulting changes. This makes it possible to take countermeasures more efficiently.

In this way, favorable EMS countermeasures are taken thus making it possible to provide automatically and with high speed the reliable layout structure of a semiconductor integrated circuit.

BRIEF DESCRIPTION OF THE DRAWING

FIG. 1 is a block diagram showing a configuration of the first embodiment of the invention;

FIG. 35 shows a conventional EMS analysis method;

FIG. 36 shows another conventional EMS analysis method; and

FIG. 37 shows the first embodiment of the invention.

DETAILED DESCRIPTION OF THE PREFERRED EMBODIMENTS

Figure 2A:
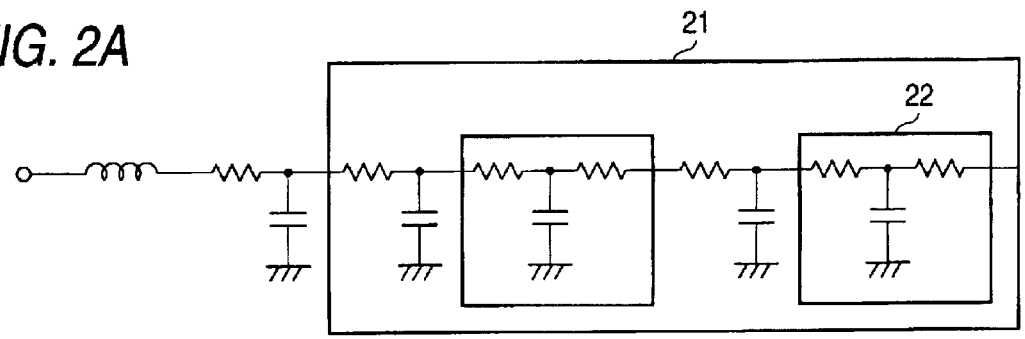
FIGS. 2A to 2D show a procedure for creating a simulation model according to the first embodiment of the invention.
Figure 2B:
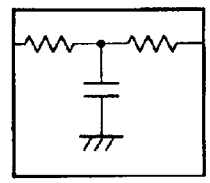

Embodiments of an EMS analysis method according to the invention will be described.

Embodiment 1

FIG. 1 is a block diagram showing the principle of a noise simulation method in this embodiment. FIG. 37 is a block diagram showing the details of the analysis section in FIG. 1. FIGS. 2A to 2D are a block diagrams explaining the procedure for creating an equivalent circuit. FIG. 3 is a flowchart showing the operation of the embodiment.

As shown in FIG. 1, analysis apparatus using the noise simulation according to the embodiment of the invention includes layout information 11, an impedance information extracting section 12, an equivalent circuit creating section 13, an analysis section 14, and a power noise waveform database 15. As shown in FIG. 37, the analysis section 14 includes a noise waveform supply section 371, a power noise waveform calculating section 372, a power noise threshold library 373, and an error section detector 374.

In this analysis apparatus, impedance information on the power wiring connecting to the external terminal of a semiconductor integrated circuit and the inter-block power wiring in the semiconductor integrated circuit and power wiring in each functional block in the semiconductor integrated circuit are respectively extracted from the layout information 11 in the impedance information extracting section 12. Concerning the power wiring external to the semiconductor integrated circuit, the resistance component, capacitance component and inductance component of the power wiring are extracted. Concerning the inter-block power wiring in the semiconductor integrated circuit and power wiring in each functional block in the semiconductor integrated circuit, the resistance component and capacitance component of the power wiring are extracted.

The equivalent circuit creating section 13 creates a circuit for analyzing the power wiring in each functional block, a circuit for analyzing the inter-block power wiring, and a circuit for analyzing the power wiring external to a semiconductor integrated circuit, based on the impedance information extracted in the impedance information extracting section 12.

Figure 2C:
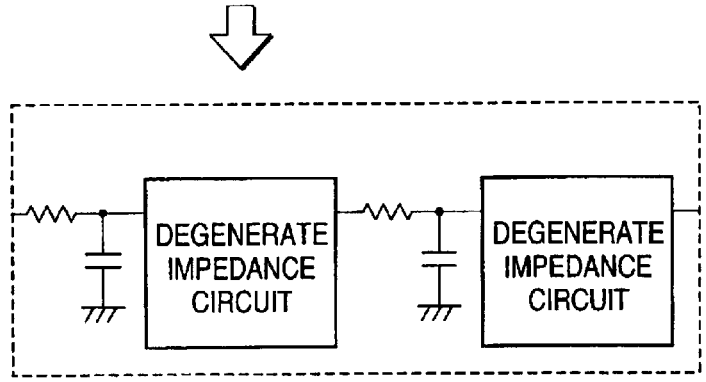

FIGS. 2A to 2D show a procedure for creating an equivalent circuit. FIG. 2A shows an impedance circuit for a target semiconductor integrated circuit. A numeral 21 represents a semiconductor integrated circuit and 22 represents a functional block. An impedance circuit representing the connection information of the resistance component and capacitance component in each functional block is used as a circuit for analyzing the power wiring in each functional block (FIG. 2B) Next, a degenerate impedance circuit of each functional block where impedance information on each functional block is compressed is created for all of the plurality of functional blocks. A circuit further including impedance information on the inter-block power wiring is used as a circuit for analyzing the inter-block power wiring (FIG. 2C).

Figure 2D:
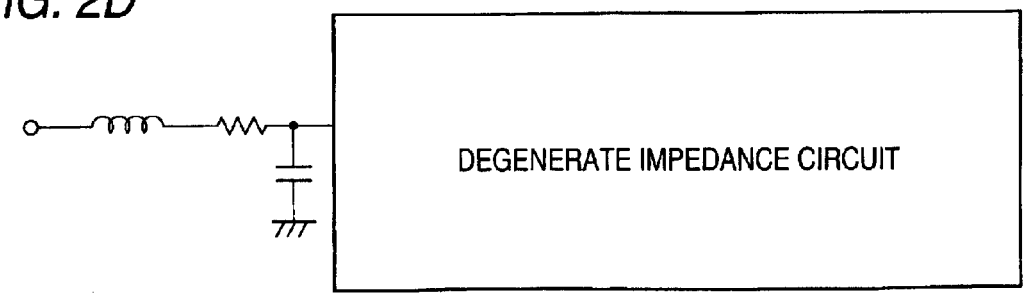
Figure 3:
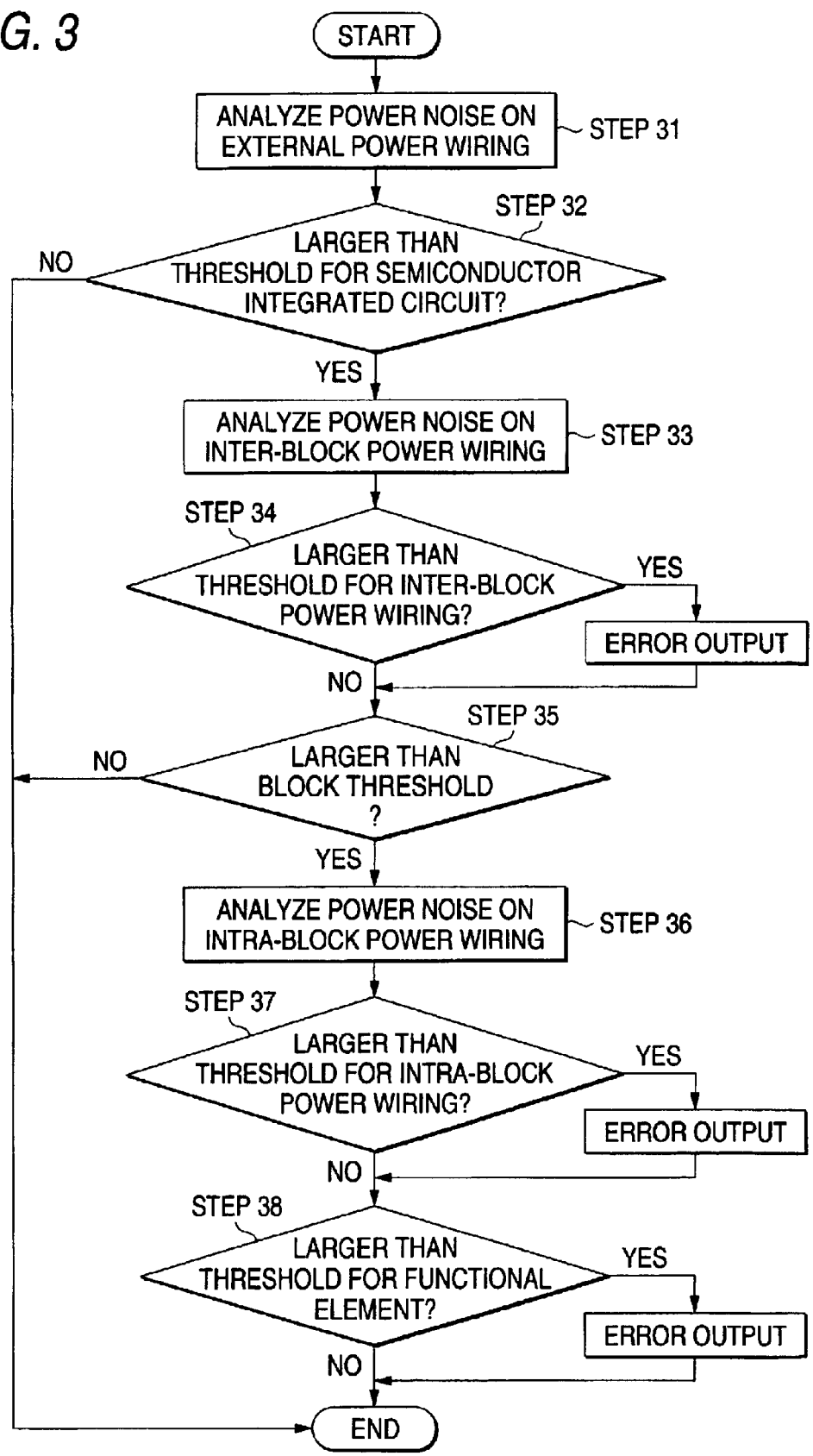
FIG. 3 is a flowchart showing the operation of the first embodiment of the invention.

Impedance information on the power wiring external to a semiconductor integrated circuit is added to the degenerate impedance circuit that is provided by compressing the circuit for analyzing inter-block power wiring and the resulting circuit is used as a circuit for analyzing the power wiring external to a semiconductor integrated circuit (FIG. 2D). The compression method is for example the AWE (Asymptotic waveform Evaluation). Degenerating RC in this way reduces the calculation time in an upper layer that uses the degenerated RC.

The analysis section 14 uses the each equivalent circuit to analyze the influence of a noise on the semiconductor integrated circuit. The analysis section will be detailed referring to FIG. 37. A noise waveform supply section 371 supplies as input information a start point noise waveform to the power line of the equivalent circuit. The power noise waveform calculating section 372 calculates the power waveform at each point of the semiconductor integrated circuit. This calculation is made separately in three stage, on the power wiring external to the semiconductor integrated circuit, inter-block power wiring, and intra-block power wiring. The power noise threshold library 373 stores the peak value of a power noise at each point in the semiconductor integrated circuit. Threshold values are determined for the semiconductor integrated circuit, each functional block, each functional element and power wiring. The threshold for the power wiring is determined by the distance to an adjacent signal line and length of parallel wiring. For each functional element, simulation is performed to obtain the minimum value of the power noise level that causes an error output, which value is used as a threshold.

The threshold for each functional block is the maximum among the thresholds for inter-block wiring and each functional elements. The threshold for the semiconductor integrated circuit is the maximum among the thresholds for the functional blocks and inter-block power wiring in the semiconductor integrated circuit. The error section detector 374 compares the threshold for the power noise peak value with the power noise waveform at each point in the power noise threshold library 373 and assumes an error where the threshold is exceeded.

When the threshold for power wiring is compared with the waveform at each internal node point, comparison is made using the T-type model as the model of power wiring, at an intermediate internal node point in the power wiring. The power waveform at the section determined as an error section is stored into the power noise waveform database 15.

Operation of this embodiment will be explained referring to FIG. 3. The power waveform containing a noise to be input to the power wiring external to the semiconductor integrated circuit is defined as a start point power noise waveform, the power waveform containing a noise at the power terminal of the semiconductor integrated circuit is defined as a semiconductor integrated circuit terminal power noise waveform, and the power waveform at the power terminal of each functional block is defined as a block terminal power noise waveform.

In step 31, the start point power noise waveform is supplied as an input to the power line of the circuit for analyzing the power wiring external to the semiconductor integrated circuit. Analysis is made on the power noise in the power line of the circuit for analyzing the power wiring external to the semiconductor integrated circuit, then the semiconductor integrated circuit terminal power noise waveform is obtained.

Instep 32, the terminal power noise waveform is compared with the power noise peak threshold provided for the semiconductor integrated circuit.

In case it is determined that the terminal power noise waveform exceeds the threshold in the determination step 32, execution proceeds to step 33 and the inter-block power wiring in the semiconductor integrated circuit is analyzed.

In the analysis step 33, the terminal power noise waveform is input to the circuit for analyzing the inter-block power wiring to obtain the power noise waveform at each internal node point in the inter-block power wiring and the terminal power noise waveform in each functional block.

In step 34, the power noise waveform is compared with the power noise peak threshold provided for each node in the inter-block power wiring.

In case it is determined that the threshold is exceeded, an error is assumed. Display is made as required to notify that the section is where a noise is propagated. In step 35, the power noise peak value provided for each block is compared with the terminal power noise waveform in each functional block.

In case it is determined that the block terminal power noise waveform exceeds the threshold in the determination step 35, execution proceeds to step 36 and the block terminal power noise waveform is input to the circuit for analyzing the power wiring in each functional block. Then the power noise waveform at each node point in the intra-block power wiring and the power noise waveform at the power inlet of each functional element are obtained.

The power noise peak threshold provided for the intra-block power wiring is compared with the power noise waveform in step 37. In case the threshold is exceeded, an error is assumed. Display is made as required to notify that the section is where a noise is propagated.

The power noise peak threshold provided for each functional element in step 38 is compared with the power noise waveform at the power inlet of each functional element. In case the threshold is exceeded, an error is assumed. Display is made as required to notify that the section is where a noise is propagated.

The section where an error is determined is where a noise entering the power line is propagated without being attenuated and the section susceptible to EMS.

In case a plurality of power terminals to a semiconductor integrated circuit are provided, the worst case is considered where the power noises entering the power inlets are propagated to the points in the semiconductor integrated circuit with the same timing. That is, the noise waveforms at all points in the semiconductor integrated circuit are obtained per power source by using the approach and the values obtained are summed up.

In case the semiconductor integrated circuit is not layered but uses a flat design, two models, the simulation model for the power wiring in the semiconductor integrated circuit and the simulation model for the power wiring external to the semiconductor integrated circuit, are configured to perform simulation in a layered approach for the exterior and interior of the semiconductor integrated circuit as well as to identify the error section.

According to the embodiment, it is possible to identify the section susceptible to a noise entering the power wiring of a semiconductor integrated circuit in the design stage. This allows countermeasures to be taken before manufacturing the semiconductor integrated circuit thus improving the noise resistance. The countermeasures include insertion of a switch circuit, insertion of an inductor, reduction of the power wiring length, and cell rank change, which will be described later.

Error indication may be selected as required, which will be described later.

Embodiment 2

The second embodiment of the invention will be described referring to the drawings.

Figure 4:
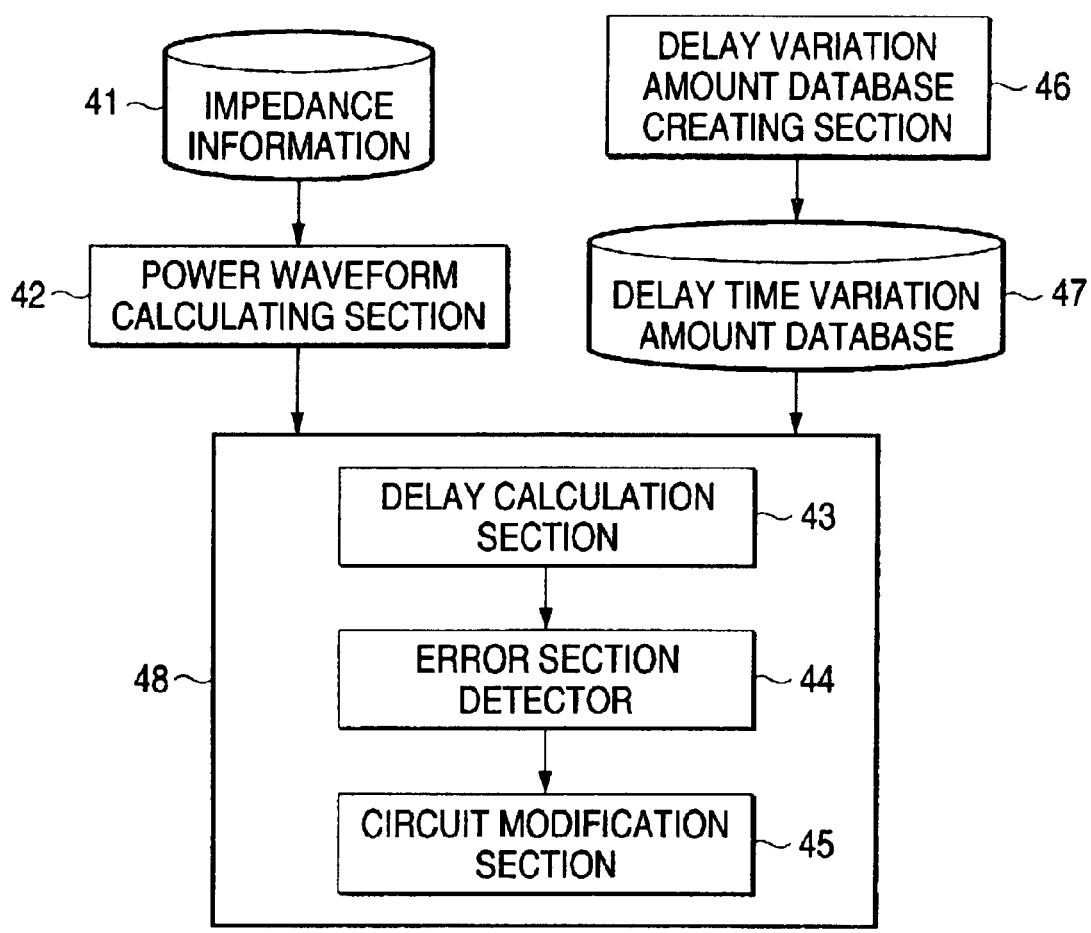
FIG. 4 is a principle drawing according to the second embodiment of the invention.

As shown in the principle drawing of FIG. 4, a circuit timing verification method according to the second embodiment of the invention includes impedance information 41 extracted from the layout information, a power waveform calculating section 42 for calculating the power noise waveform at each point in a semiconductor integrated circuit from the power noise waveform input to the impedance information, a delay variation amount database creating section 46 for obtaining the variation amount of the delay time of a circuit element assumed when the power noise input timing or peak value is varied thus creating a database, and a circuit timing verification section 48 for verifying the circuit operation from the noise waveform at the power terminal of the circuit element created by the power waveform calculating section and a delay time variation amount database 47. The circuit timing verification section 48 includes a delay calculation section 43 for calculating the delay time from the noise waveform at the power terminal of the circuit element, an error section detector 44 for detecting a circuit section where a signal does not arrive within a time required for circuit operation due to a variation in the delay time of a circuit element caused by an arbitrary power noise provided thus resulting in an unexpected circuit operation, and a circuit modification section 45 for changing a circuit element in order to satisfy the constraint time in the circuit section where an unexpected circuit operation occurs in case an arbitrary power noise is provided. Such modification provides a semiconductor integrated circuit with noise resistance improved.

Namely, a circuit timing verification method according to the second embodiment of the invention includes impedance information 41 on the power wiring, a power waveform calculating section 42 for obtaining the power noise waveform at each circuit element from the power noise waveform input to the power terminal, a circuit timing verification section 48 for detecting a circuit section where a signal does not arrive within a time required for circuit operation due to a variation in the delay time of a circuit element thus resulting in an unexpected circuit operation, and a delay variation amount database creating section 46 for creating a delay variation amount database 47 that describes the variation amount of delay of a circuit element due to a power noise.

The circuit timing verification section 48 includes a delay calculation section 43 for calculating the delay amount of a circuit element from the delay time variation amount database 47 and calculating the delay value that considers a noise, an error section detector 44 for detecting a circuit section where a signal does not arrive within a time required for circuit operation due to a variation in the delay time of a circuit element thus resulting in an unexpected circuit operation, and a circuit modification section 45 for improving the power noise resistance on the error section.

Figure 5:
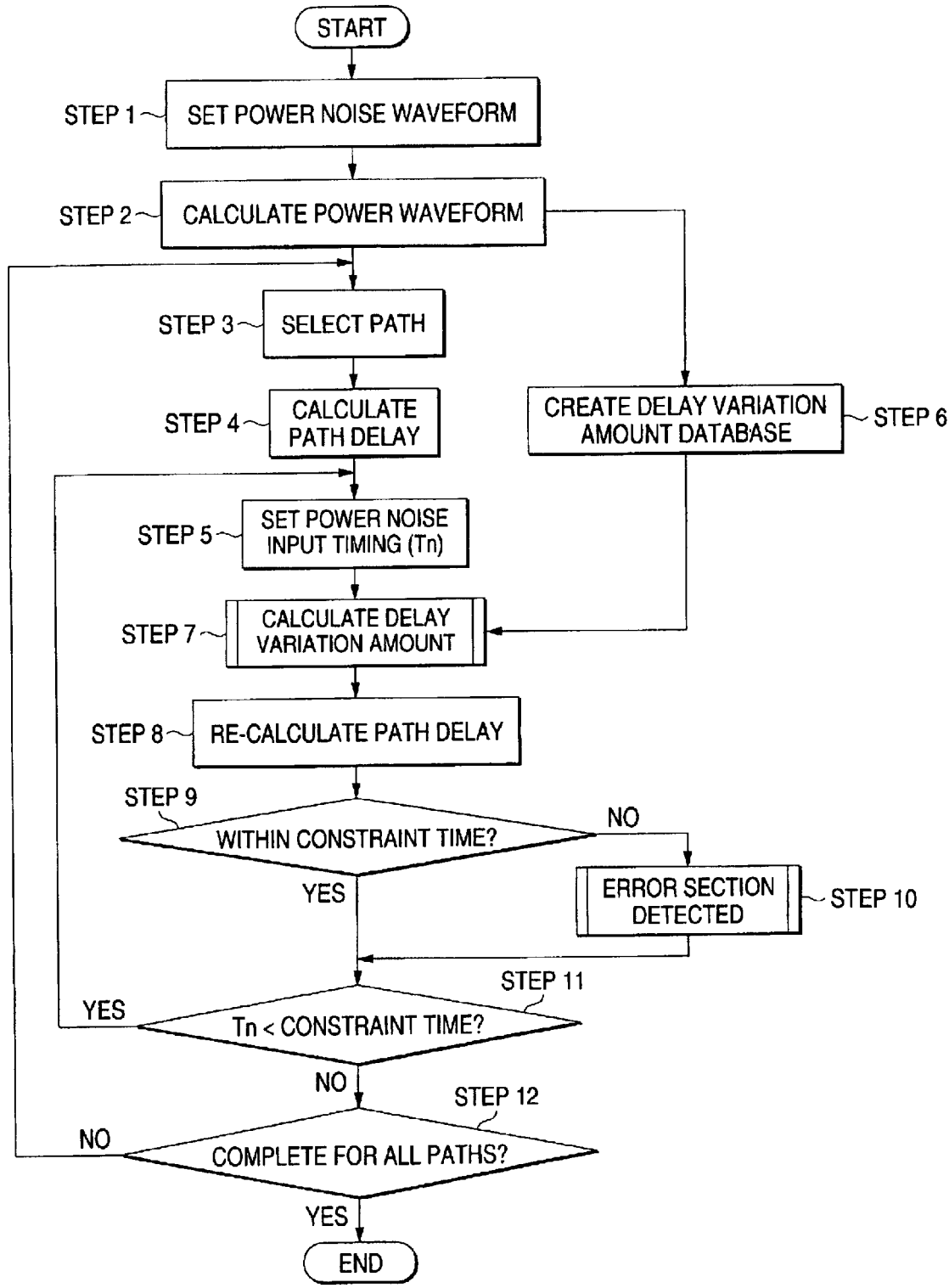
FIG. 5 is a flowchart showing the circuit timing verification method in the second embodiment of the invention.

FIG. 5 is a flowchart of a circuit timing verification method in the embodiment of the invention. A circuit element having a specific feature is defined as a cell and a series of circuit elements as a path. In FIG. 5, the power noise waveform to be input to the power wiring of a semiconductor integrated circuit is set (step 1), then the power waveform at each circuit element is obtained in the power waveform calculating section 42 from the impedance information 41 and the input power noise waveform (step 2). In the delay variation amount database creating section 46, the delay amount obtained when the peak value and the power noise input timing with regard to the variation time of an input signal are varied are calculated to create a delay variation amount database 47 (step 6).

Next, a path is selected for obtaining the delay variation amount due to a power noise (step 3). In the selection of a path, the delay variation amount is calculated for a path where the delay value obtained by summing the path delay value assumed when no power noises are present and the maximum delay variation amount caused by a power noise at each cell is over the constraint time, thereby narrowing down the candidate paths.

The path delay time assumed when the input timing of a power noise is varied for the selected path is calculated in the delay calculation section 43. The delay calculation section 43 first calculates the path delay value T1 when no power noises are present (step 4), sets the initial input timing Tn of the power noise (step 5), calculates the delay variation amount T2 caused by the power noise on the path (step 7), and sums up T1 and T2 to obtain the path delay value T3 that considers the power noise (step S8).

Then it is determined whether the path delay satisfies the constraint time (step 9). In case the path delay exceeds the constraint time, the error section detector 44 detects the cell with the largest delay caused by the power noise on the path (step 10). In case the path delay is within the constraint time, the input timing of the power noise is varied by a certain step width and steps 5 through 11 are repeated. In case the path delay time satisfies the constraint time with the input timing of the power noise provided, the path has no corresponding power noise.

Steps 3 through 12 are repeated for all the paths.

To obtain the maximum variation amount of the path due to a power noise, the maximum variation amount of each cell is obtained from the delay variation amount database. The input timing of the power noise that shows the largest variation is obtained. The delay variation amount of the path with the input timing is defined as the maximum variation amount. In this way, the delay variation amount of the path can be calculated through single operation.

Figure 6:
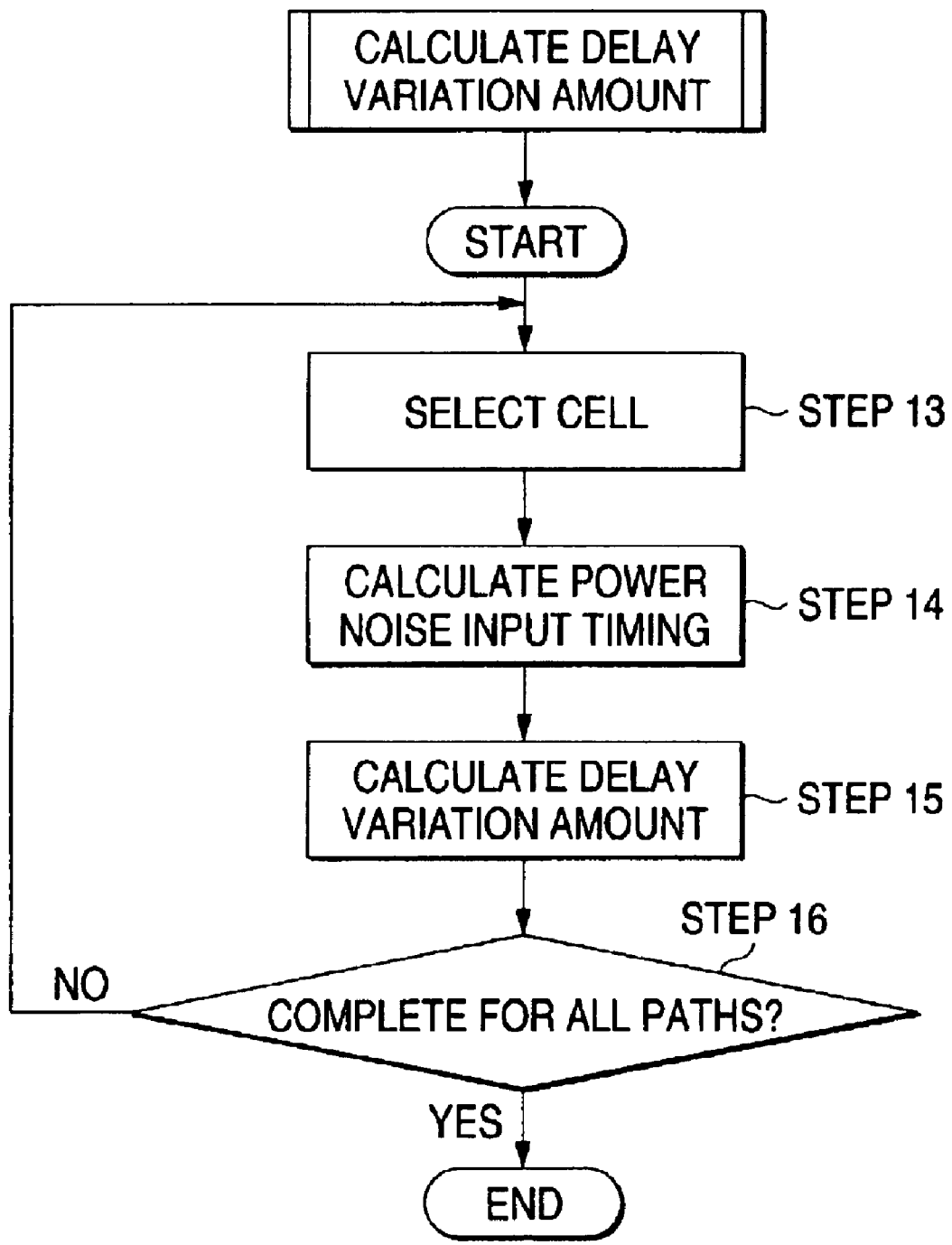
FIG. 6 is a flowchart of the operation of the delay variation calculation section according to the second embodiment of the invention.

FIG. 6 is a flowchart of the operation of the delay variation calculation section 43. In FIG. 6, a cell is selected from the selected path (step 13). The input timing of a power noise with regard to the input signal variation of the cell is calculated (step 14). The power noise peak value for the cell and the power noise input timing are used to calculate the delay variation amount based on the delay variation amount database 47 (step 15).

Steps 13 through 16 are repeated until the delay variation amount of all the cells is calculated on the path.

Figures 7, 8:
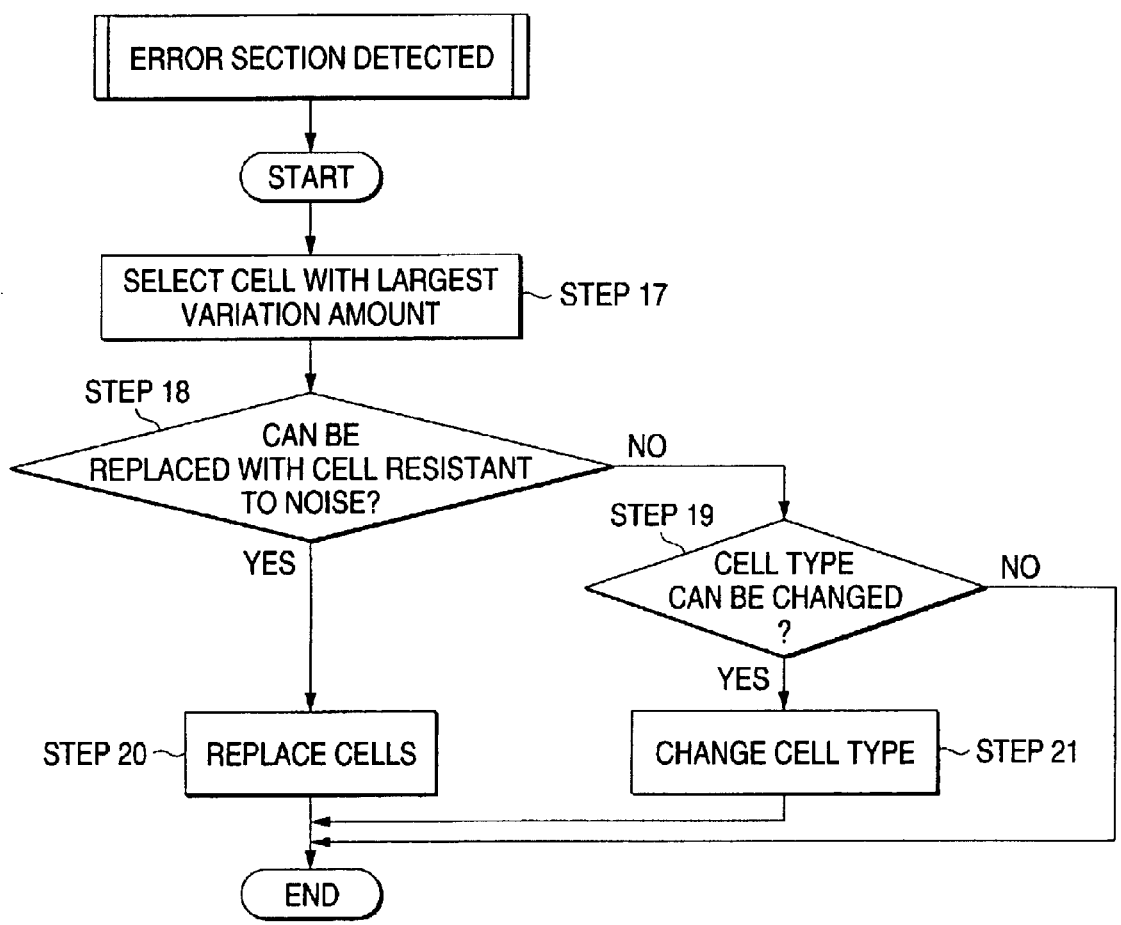
FIG. 7 is a flowchart of the operation of the error section detector according to the second embodiment of the invention.
FIG. 8 shows the contents of the delay database according to the second embodiment of the invention.

How to calculate the delay variation amount caused by a power noise will be described. the delay time assumed when the peak value and the input timing of the power noise with regard to the variation time of the input signal are varied per cell in the delay variation amount database creating section 46, to create a delay variation amount database. FIG. 8 shows the contents of the delay variation amount database which includes three factors: cell names, peak values and delay variation amount of the power noise per input timing. The cell delay variation amount is obtained using as keys a cell name, peak value and input timing of power noise in the delay variation amount database. It is also possible to obtain the delay variation amount in percentage as a rate of variation with regard to the delay time that results when a power noise is not input and thus create a delay variation rate database, then obtain the delay variation amount by multiplying by the rate the delay value assumed when power noise is not considered. In the database, peak values and the input timings of the power noise are retained as data in certain steps while data is approximated to calculate the delay variation amount when the necessary peak value and input timing are not available from the data.

FIG. 7 is a flowchart of the operation of the error section detector 44. In FIG. 7, the cell with the largest variation in the cell delay value caused by a power noise is selected from the path (step 17). It is determined whether the cell can be replaced with another cell of the same type experiencing smaller delay variation amount caused by a noise (step 18).

In case replacement is possible, the cell is replaced with the cell experiencing smaller delay variation amount (step 20). Otherwise, it is determined whether the constraint time can be satisfied by changing cell types (step 19). In case the constraint time can be satisfied by such a change, cell types are changed (step 21).

According to the embodiment, it is possible to obtain the delay time variation at each circuit element assumed when a power noise is input to a semiconductor integrated circuit, and thus to detect a circuit element where an unexpected circuit operation results due to a variation on the delay time. It is possible to improve the resistance of the circuit to a power noise by improving the resistance of the circuit element to a noise.

In this way, it is possible to evaluate through simulation the resistance to a power noise and take necessary countermeasures before manufacturing the semiconductor integrated circuit. This reduces the design period, reduce the development costs and brings the design nearer to perfection.

Embodiment 3

Figure 9A:
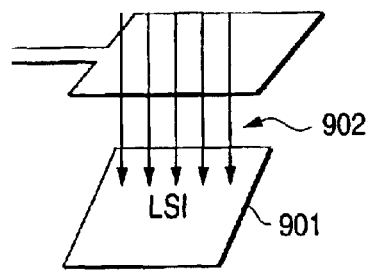
FIGS. 9A and 9B show the third embodiment of the invention.
Figure 9B:
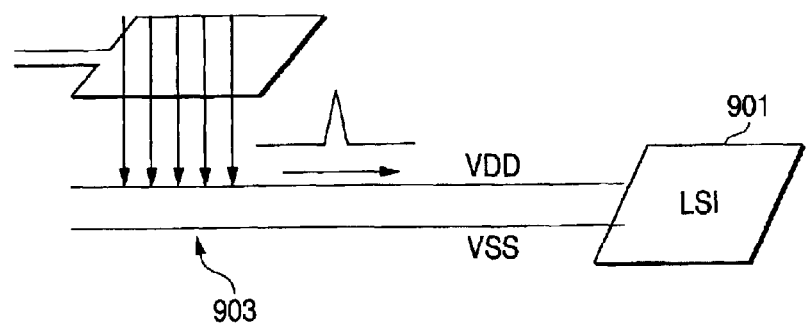

The third embodiment of the invention will be described. In the third embodiment, the analysis of the LSI circuit 901 considers a direct EMS caused by electromagnetic radiation 902 shown in FIG. 9A and an indirect EMS from the power source 903. Which section of the LSI circuit 901 is weak in terms of invasion of a noise and thus needs modification in order to improve the resistance of the LSI circuit to a noise, as described hereinafter.

Figure 10:
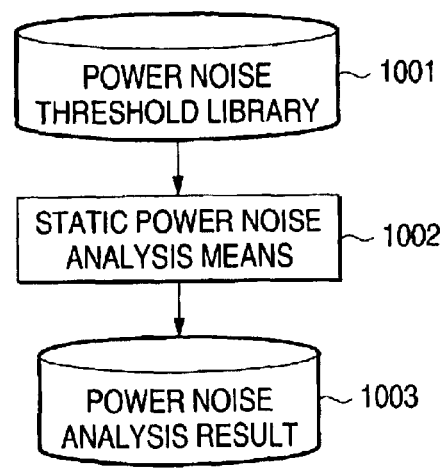
FIG. 10 shows the third embodiment of the invention.

In this method, as shown in FIG. 10, the threshold for a noise for changing the output result or internal state of the LSI circuit is calculated on the power noise propagation path. The data is stored into a power noise threshold library 1001. It is analyzed whether each of all the circuit elements of the LSI circuit suffers from a power noise while referring to the power noise threshold library 1001 in static power noise analysis means 1002. Then the analysis data is output as a power noise analysis result 1003. With this configuration, it is possible to analyze the circuit for all the circuit elements in the LSI circuit in a static and exhaustive fashion without using a test vector. This allows all the corresponding circuits to be checked and reduces the analysis time.

Next, the power noise threshold library will be described. The power noise threshold library retains as functions or values the thresholds used for passage of a noise. Preferably, the information as to whether the noise can cause an electrostatic damage to a circuit is also incorporated in the library.

Figure 11A:
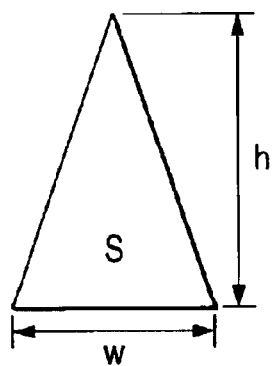
FIG. 11 shows the third embodiment of the invention.
Figure 11B:
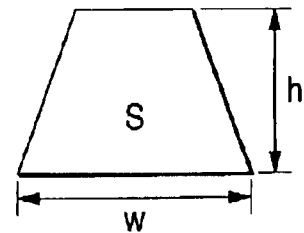
Figure 11C:
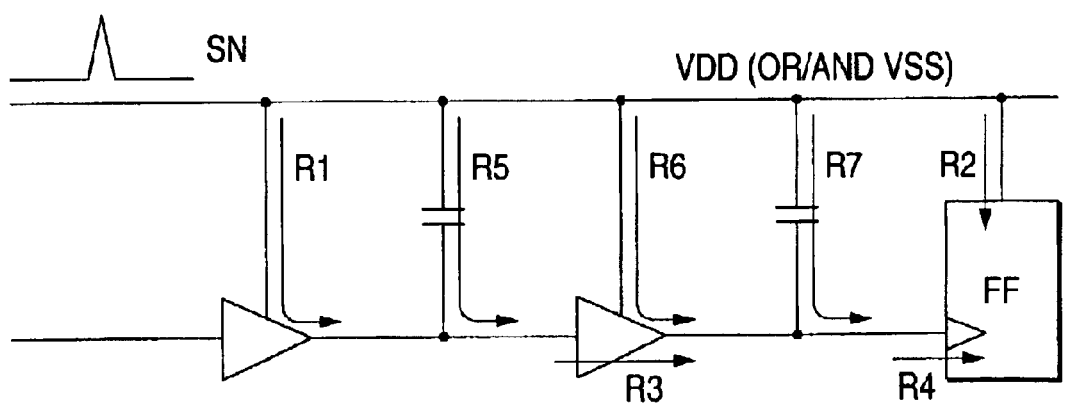

Details of the power noise threshold library are shown in FIG. 11A through FIG. 11C. As shown in FIG. 11A or 11B, a threshold used for passage of a noise is either or a combination of the peak value of a noise current or voltage entering each of the circuit elements (including capacitance elements, logic gates and register elements), noise width, and noise shape.

Thus a library of various data is created. This library may include one or more parameter functions among the input power resistance, the input resistance-capacitance, the output resistance, the output capacitance, and input drive capabilities in case a circuit element is provided at the input.

As shown in FIG. 1C, the path where a noise passes may be at least one information item among: path (R1, R6) from a power line (VDD, VSS) to the output terminal of a circuit element via the power terminal of the circuit element; path from a power supply (VDD, VSS) to the internal state of a register element via the power terminal of the register element (R2); path from the input terminal to the output terminal of a circuit element (R3); path from the input terminal of a register element to the internal state of the register element (R4); and path from a power line to a signal line via a capacitance element (R5, R7).

Figure 12:
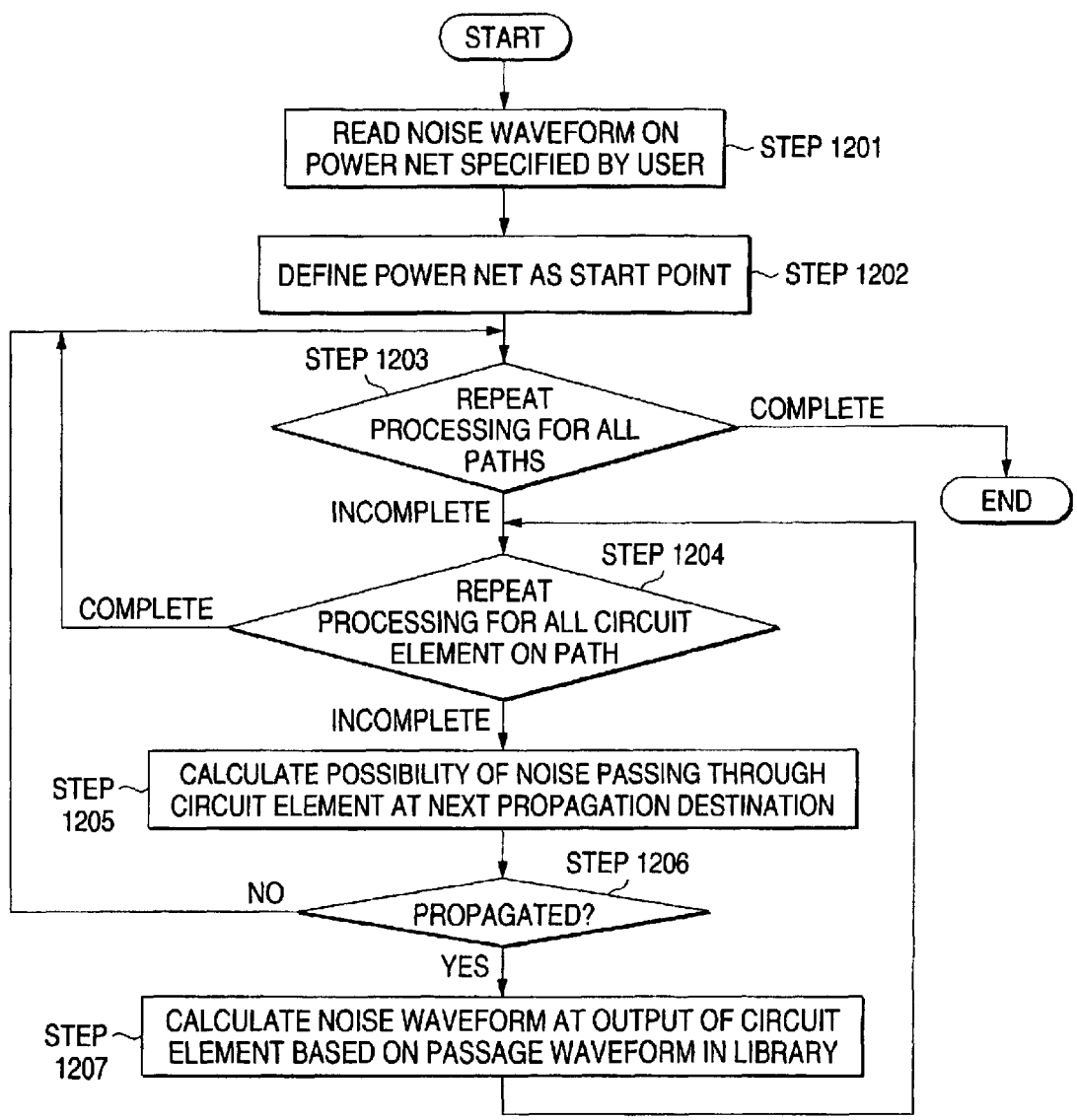
FIG. 12 shows the third embodiment of the invention.

The actual analysis processing will be described. FIG. 12 is a basic flowchart of the analysis processing.

As shown in FIG. 12, the noise waveform on the power net specified by the user is read (step 1201).

Then the power net is defined as a start point (step 1202), whether processing is complete for each path is determined and the procedure is repeated until the processing is complete for all the paths (step 1203).

The procedure is repeated until the processing is complete for all the circuit elements on the path (step 1204). The possibility of noise passing through the circuit element at the next propagation destination is calculated based on the library (step 1205).

The possibility of noise passing through the circuit element at the next propagation destination is determined (step 1206). In case it is determined that the noise passes and is propagated through the circuit element, the noise waveform at the output of the circuit element at the next propagation destination is calculated based on the passing waveform in the library (step 1207).

In case it is determined that processing is not complete for all the circuit elements on the path in the determination step 1204, execution returns to step 1205 to repeat the procedure for all the circuit elements on the path.

In case it is determined that the noise will not pass the circuit element in the determination step 1206, or in case it is determined that processing is complete for all the circuit elements on the path in the determination step 1204, execution returns to step 1203 to repeat the procedure for all the circuit elements on the path.

In this way, it is determined whether all the circuit elements of the LSI circuit are influenced by a power noise with reference to the library storing the threshold of a noise for changing the output result or internal state depending on a power noise. This allows secured and reliable EMS analysis.

Various variations are possible by using the flowchart of FIG. 12 as a basic flowchart.

Variation 1

Figure 13:
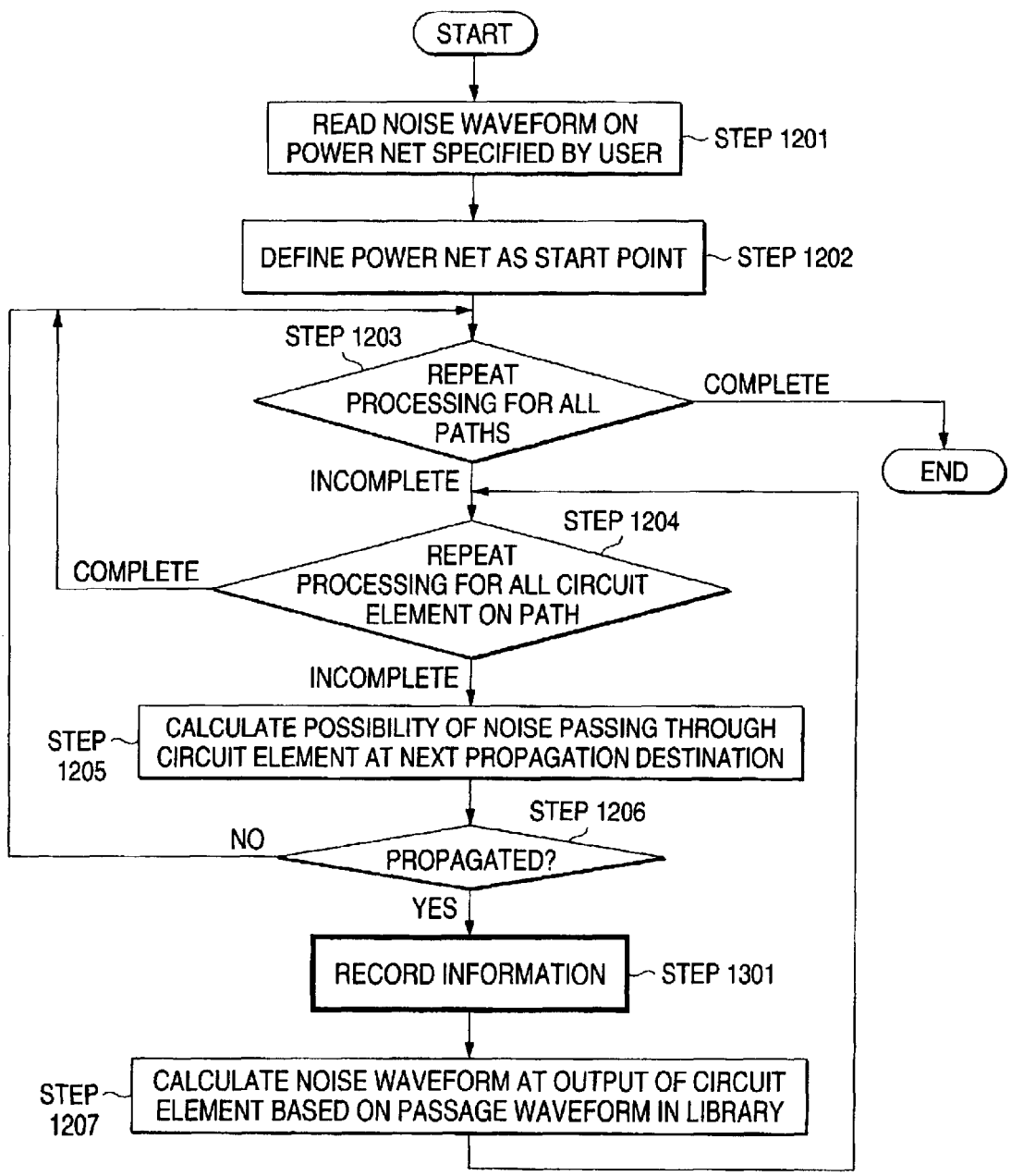
FIG. 13 shows the third embodiment of the invention.

FIG. 13 is a variation example of the basic flowchart of FIG. 12. Inserting a recording step 1301 between the determination step 1206 and the calculating step 1207 of calculating the noise waveform at the propagation destination shown in the basic flowchart of FIG. 12 allows recording of propagation path information in case propagation is determined in the determination step 1206.

Figure 14:
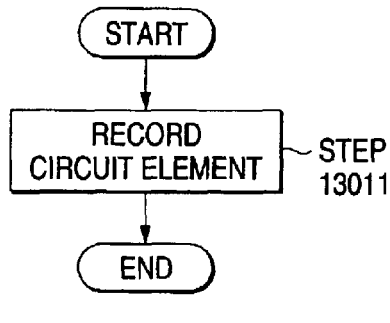
FIG. 14 shows the third embodiment of the invention.

FIG. 14 is a first example of the recording step 1301. In step 13011, information on the circuit element at the propagation destination is recorded (or flag is set) as propagation path information.

Figure 15:
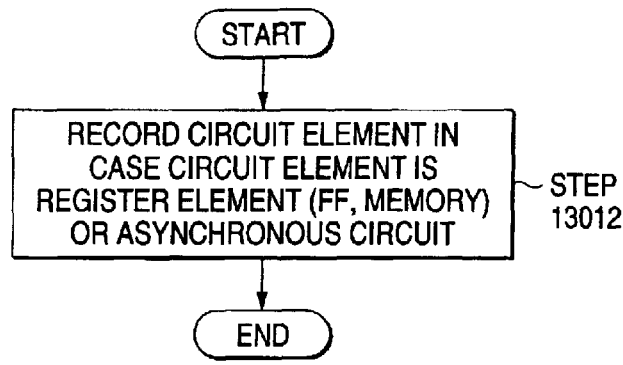
FIG. 15 shows the third embodiment of the invention.

FIG. 15 is a second example of the recording step 1301. In step 13012, in case the circuit element at the propagation destination is a register element or asynchronous circuit, information on the circuit element at the propagation destination is recorded (or flag is set) as propagation path information. That is, it is determined whether the propagation destination is a critical section where the output result of the LSI circuit is other than expected and only such circuit elements are recorded (or flag is set).

Figure 16:
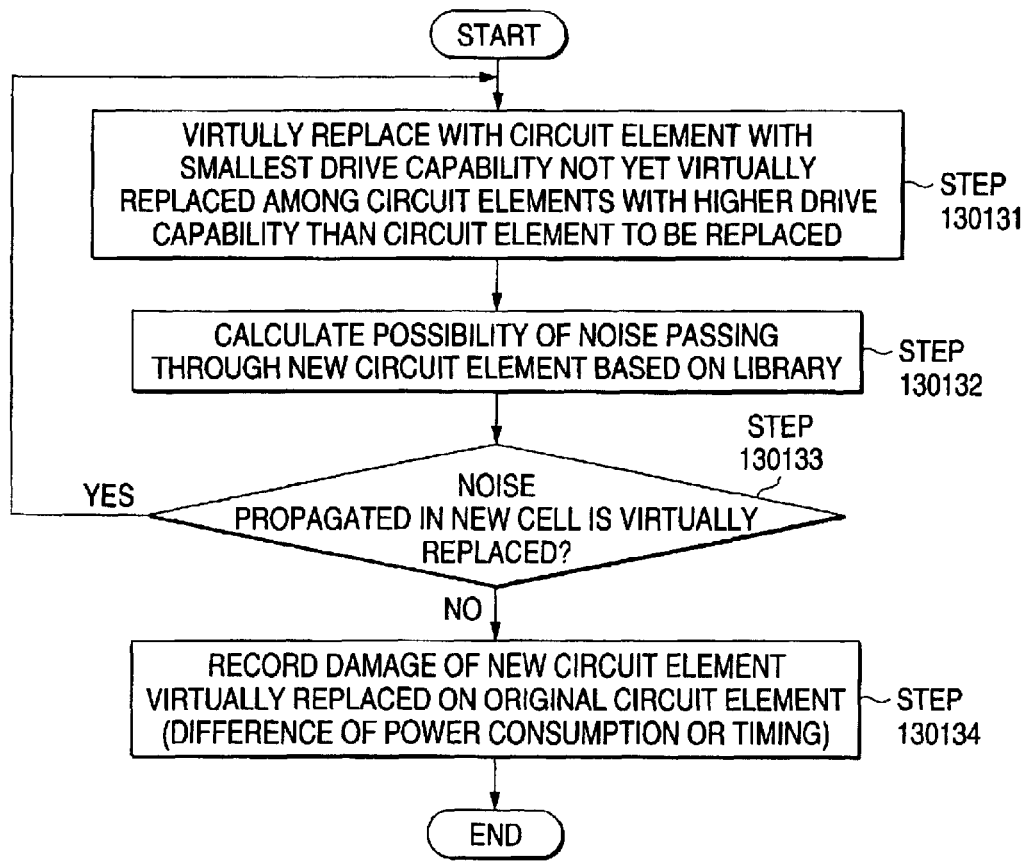
FIG. 16 shows the third embodiment of the invention.

FIG. 16 is a third example of the recording step 1301. The circuit element at the propagation destination is virtually replaced with a circuit element with the smallest drive capability which is not yet virtually replaced among the circuit elements with higher drive capability (step 130131). The possibility of noise passing through the new circuit element at the next propagation destination is calculated based on the library (step 130132). When it is determined whether a noise is propagated in the new cell virtually replaced (step 1301133). In case it is determined that the noise will not be propagated, a damage of the new circuit element virtually replaced on the original circuit element (difference of power consumption or timing) is recorded (step 130134). It is determined that the noise will not be propagated in the determination step 130133, execution returns to step 130131 and the procedure is repeated until there are no circuit elements to be replaced with spare.

With this configuration, it is possible to detect an increase in the power consumption assumed when for example a buffer is replaced with one with larger drive capability so as to prevent a noise from being propagated.

Variation 2

Figure 17:
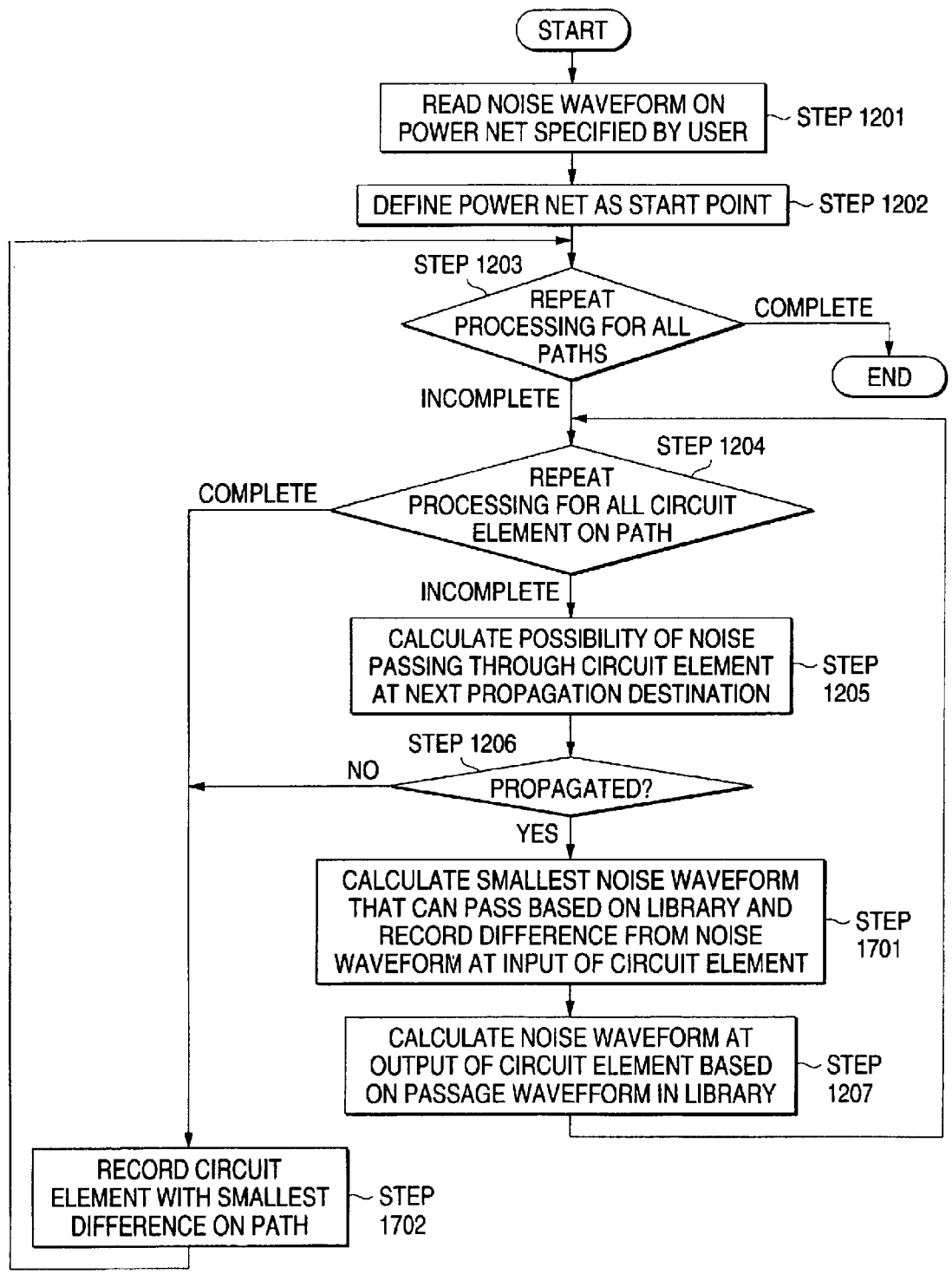
FIG. 17 shows the third embodiment of the invention.

FIG. 17 is a second variation example of the basic flowchart of FIG. 12. Inserting a conditional recording step 1701 between the determination step 1206 and the calculating step 1207 of calculating the noise waveform at the propagation destination shown in the basic flowchart of FIG. 12 allows calculation of the smallest noise waveform that can pass through propagation destination based on the library and recording of the difference from the noise waveform at the input of the circuit element, in case propagation is determined in the determination step 1206.

Inserting a recording step 1702 between the determination steps 1204, 1206 and the determination step 1203 of the basic flowchart of FIG. 12 to record the circuit element with the smallest difference on the path based on the difference information recorded in step 1701 allows recording of the difference between the propagated noise waveform and the noise waveform corresponding to the threshold used for passage of a noise thereby identifying the cell to be replaced.

With this configuration, a cell carrying a larger noise is replaced with one carrying a smaller noise thus making it possible to obtain a secured and reliable product.

Variation 3

Figure 18:
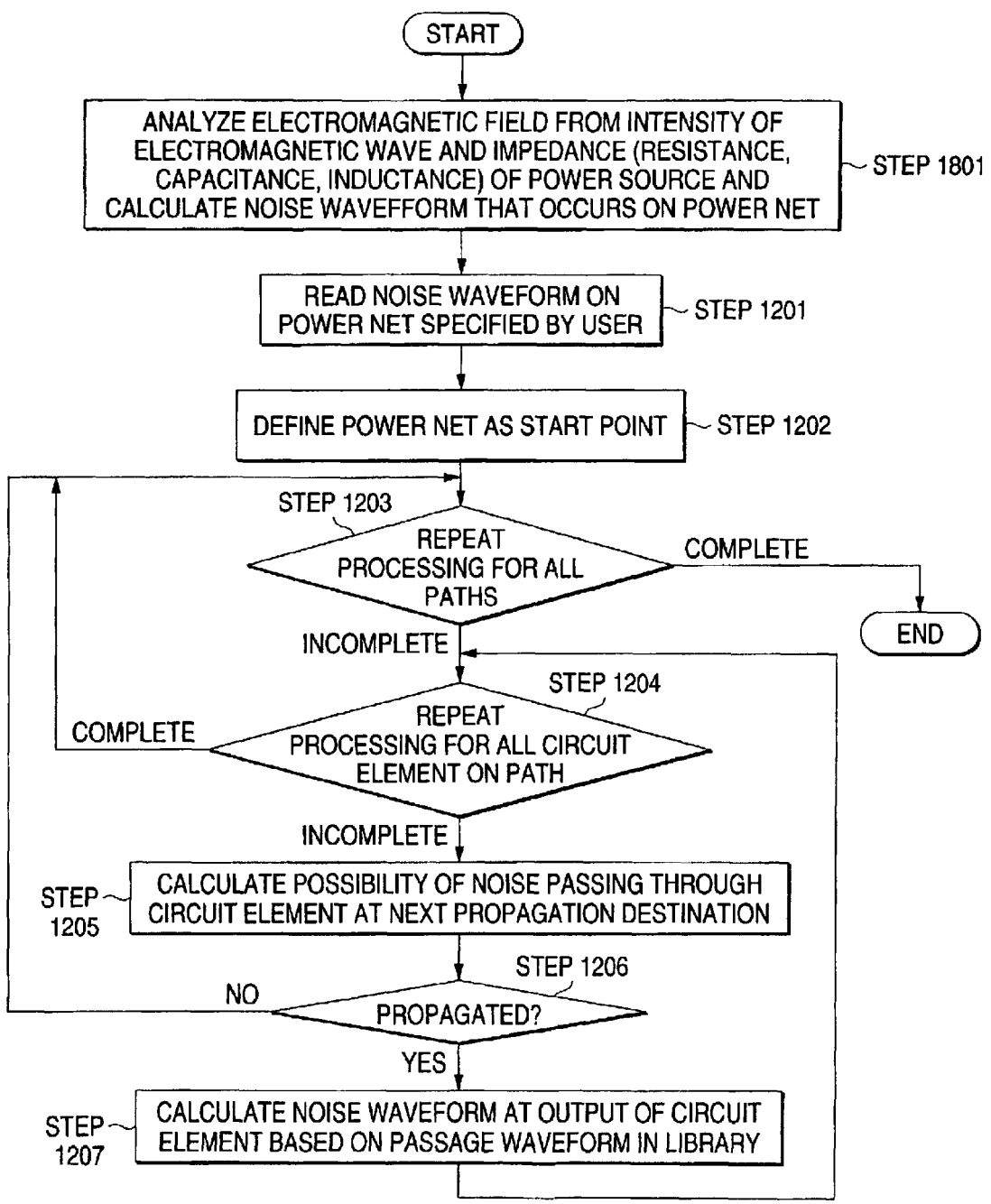
FIG. 18 shows the third embodiment of the invention.

FIG. 18 is a third variation example of the basic flowchart of FIG. 12. This example is characterized by inserting a calculating step 1801 of analyzing the electromagnetic field from the intensity of the electromagnetic wave and the impedance (resistance, capacitance, inductance) of the power source and calculating a noise waveform that occurs on the power net, just before a step 1201 of reading the noise waveform on the power net specified by the user in the basic flowchart shown in FIG. 12.

Embodiment 4

The fourth embodiment of the invention will be described. In this embodiment, contrary to the third embodiment, a method is used that traces from the propagation destination circuit element in backward direction and detects the minimum noise amount to reach the propagation destination and the most efficient circuit element to suppress the propagation.

Figure 19:
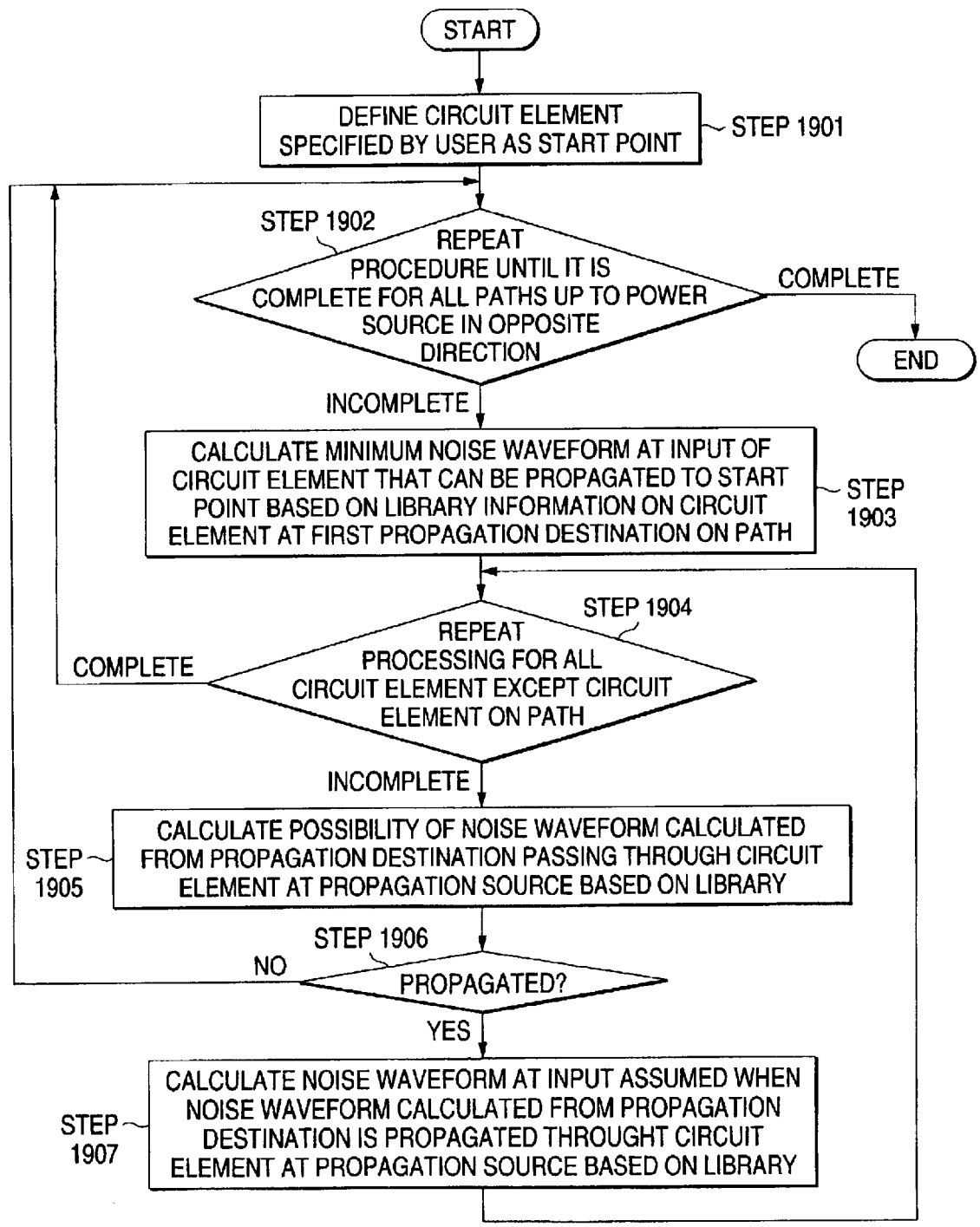
FIG. 19 shows the fourth embodiment of the invention.

FIG. 19 is an analysis flowchart.

As shown in FIG. 19, the section specified by the user is defined as a start point (step 1901).

Next, it is determined whether the procedure is complete for all the paths up to the power source in the opposite direction. The procedure is repeated until it is complete for all the paths (step 1902).

The minimum noise waveform at the input of the circuit element that can be propagated to the start point is calculated based on the library information on the circuit element at the first propagation destination on the path (step 1903).

It is determined whether the procedure is complete for all the paths except the circuit element at the start point. The procedure is repeated until it is complete for all the paths (step 1904).

Then, the possibility, that noise waveform calculated from the propagation destination is passed through the circuit element at the propagation source, is calculated based on the library (step 1905).

The possibility of passing through the propagation destination is determined (step 1906). In case the waveform is determined to pass through the destination, the noise waveform at the input assumed when the noise waveform calculated from the propagation destination is propagated through the circuit element at the propagation source is calculated based on the library (step 1907). Execution returns to step 1904 and the procedure is repeated for all the propagation source.

In case the procedure is followed for all the paths in step 1904 or in case it is determined that the waveform will not be propagated in step 1906, execution returns to step 1902 and the procedure is repeated until it is complete for all the paths up to the power source.

In this way, it is possible to calculate the maximum passage noise.

Embodiment 5

Figure 20:
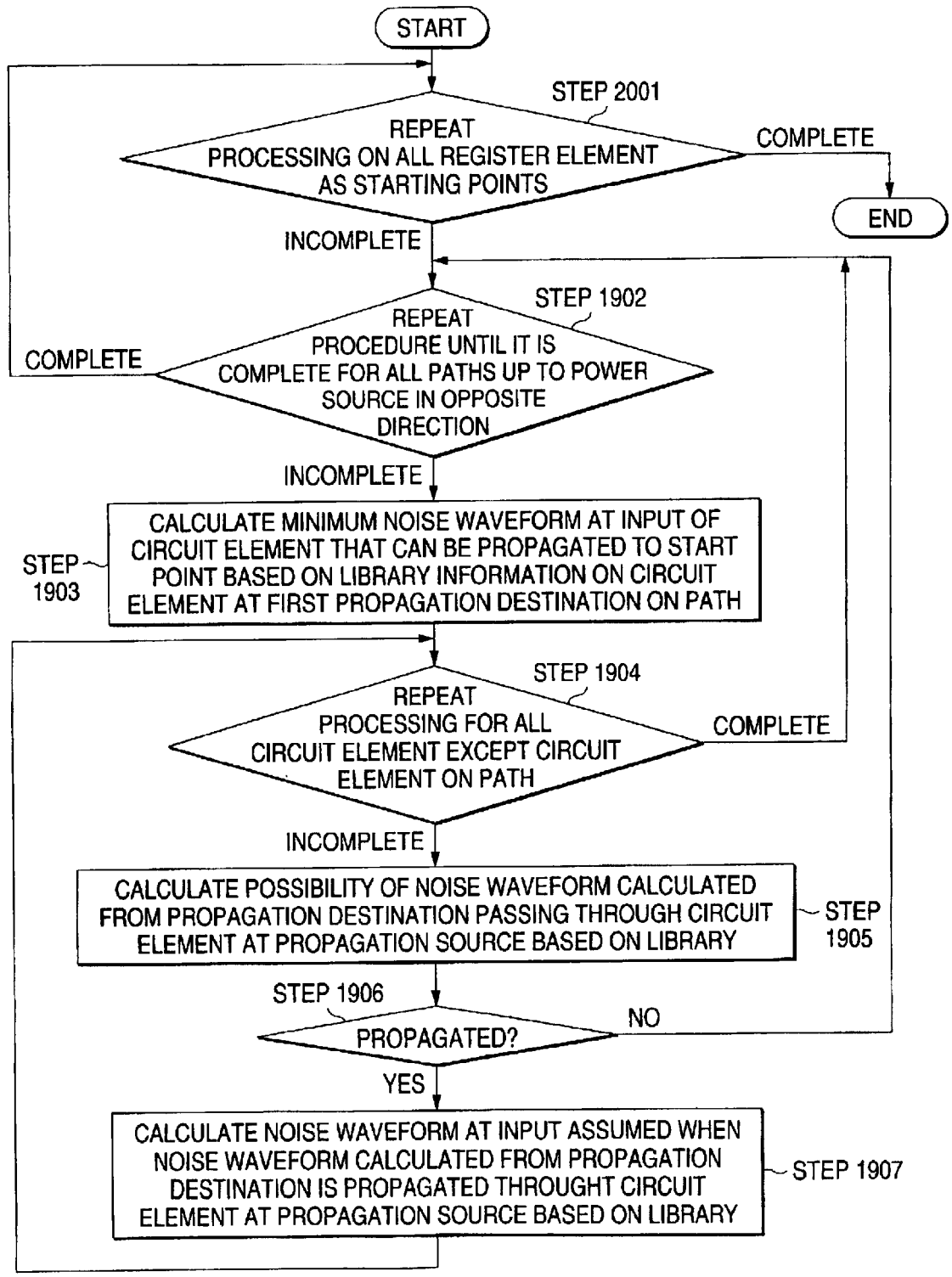
FIG. 20 shows the fifth embodiment of the invention.

FIG. 20 is a variation example of the basic flowchart of FIG. 12. Using a repetition step 2001 instead of the start point specification step 1901 in the flowchart of FIG. 19 allows repeated execution of the flowchart in FIG. 19 using each of all the register elements as a start point.

Embodiment 6

Next, the procedure after the analysis using the aforementioned analysis method will be described.

Figure 21:
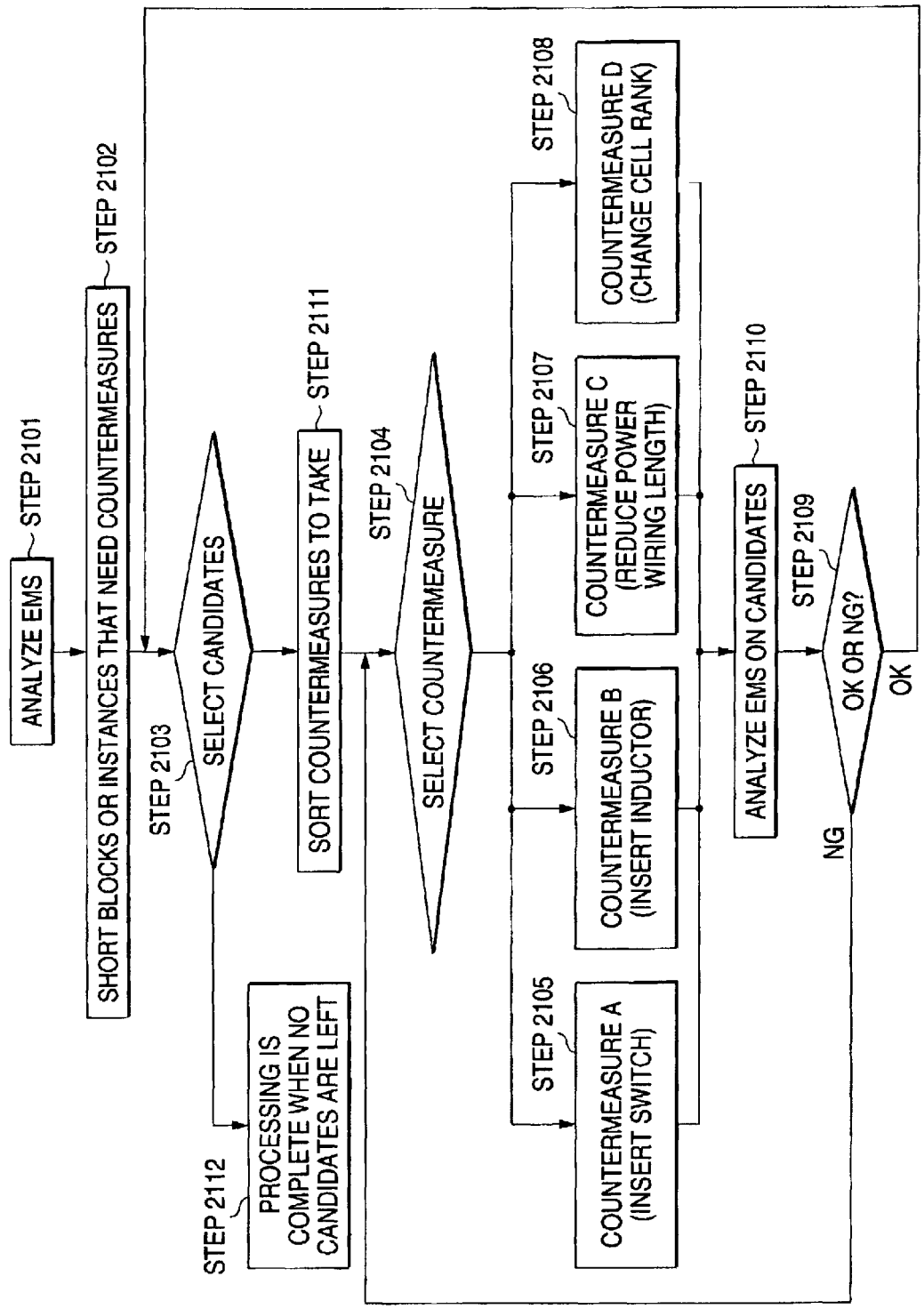
FIG. 21 shows the sixth embodiment of the invention.

FIG. 21 is a procedure flowchart. The procedure is characterized in that the procedure comprises a step 2101 of analyzing an electromagnetic disturbance in the LSI circuit, a sorting step 2103 of sorting blocks or instances that need countermeasures based on the analysis result 2102, a step 2104 of sequentially detecting propagation paths and extracting candidate blocks, a first to fourth countermeasure steps 2105 through 2108 of applying countermeasures to erase the power noise to each block and instance, an analysis step 2109 of performing EMS analysis on the blocks or instances that have undergone the countermeasures thus analyzing whether noise countermeasures have been effected, and that processing steps and analysis steps are repeated until the influence of a power noise is determined below a predetermined value in the analysis step.

Figure 22:
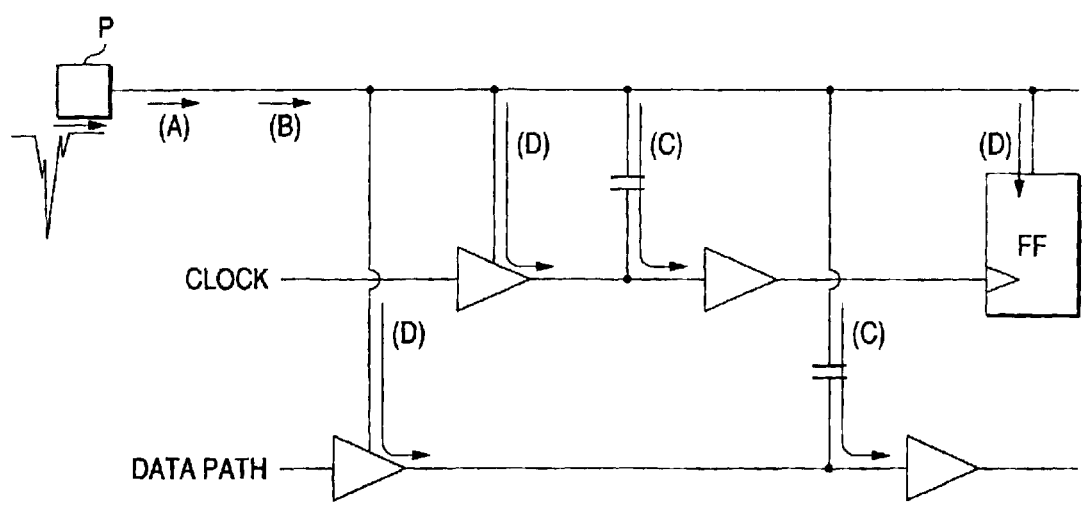
FIG. 22 shows the sixth embodiment of the invention.

The noises in question are, as shown in the explanatory drawing of propagation paths shown in FIG. 22, Noise A and Noise B that enter from an external power source to an internal power source via a power pad P, Noise C caused by a crosstalk that springs from the power source and the signal line and Noise D where a variation in the power is carried on the signal line.

The first through fourth countermeasure steps 2105 through 2109 are executed on each of the noises propagated on separate paths.

Instep 2103, blocks that need counter measures are sorted based on the analysis result 2102 and propagation paths are sequentially identified among the aforementioned paths. For Noise A and Noise B that enter from an external power source to an internal power source (see FIG. 22), the first countermeasure step (2105) of inserting a switching element and the second countermeasure step (2106) of inserting an inductor are respectively executed.

Figure 23:
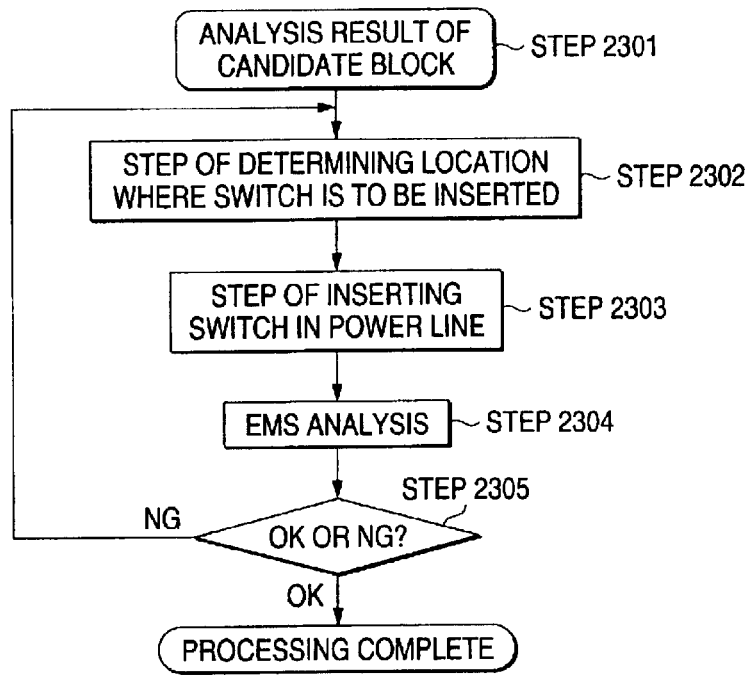
FIG. 23 shows the sixth embodiment of the invention.
Figure 24:
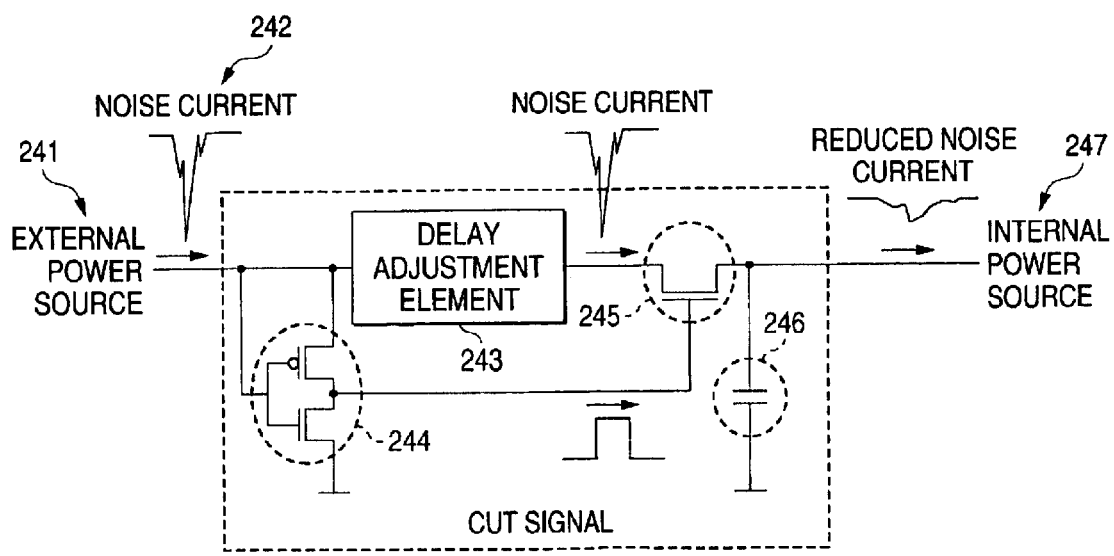
FIG. 24 shows the sixth embodiment of the invention.

The first countermeasure step, as shown in the flowchart of FIG. 23 and the switch circuit in FIG. 24, makes control using a delay adjustment element so that the switch will be turned OFF (high resistance) with the timing a noise current flows into the switching element. The switching element and the capacitance element form an RC filter that filters out a noise component.

The switch circuit is configured, as shown in the equivalent circuit in FIG. 24, to provide a high resistance in the switching element 245 by using a cut signal generating element 244, a delay adjustment element 243 for adjusting the delay time of an input signal, and a cut signal generated by a cut signal generating element 244 from the noise circuit delayed by the cut signal generating element 244 when a noise current 242 is input to an internal power source 247 from an external power source 241. The switch circuit then uses the high resistance and a capacitance 246 to form an RC filter to filter out a noise of a predetermined frequency.

Figure 25:
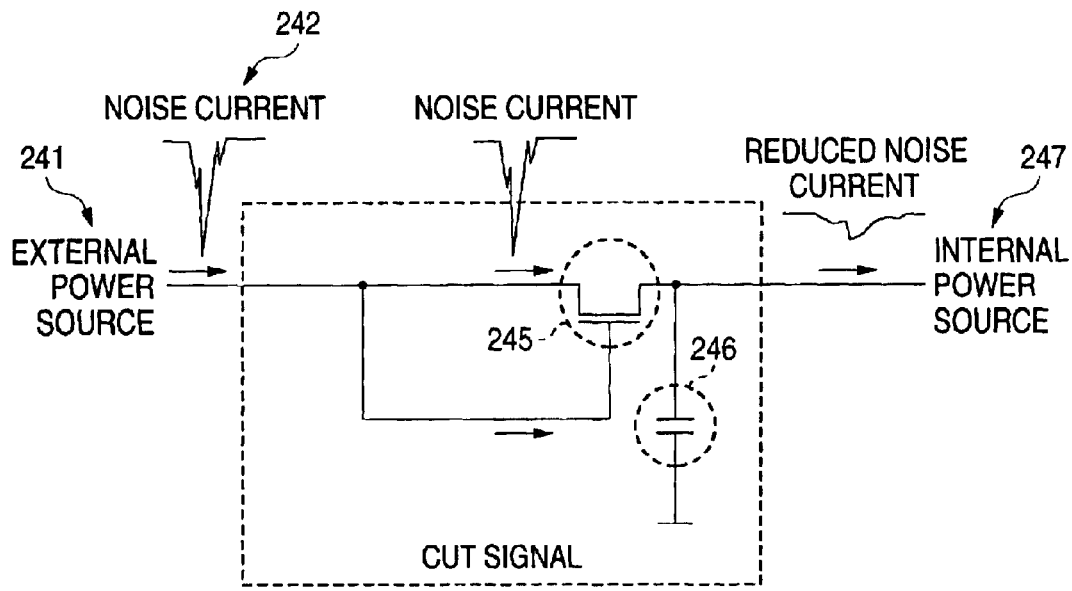
FIG. 25 shows the sixth embodiment of the invention.

The cut signal generating element 244 and the delay adjustment element 243 for generating the delay time of an input signal may be omitted as a variation example, as shown in the equivalent circuit of FIG. 25. In this case, the timing may be shifted slightly although it is possible to remove a noise signal.

The first countermeasure step extracts the candidate block in step 2104 as shown in FIG. 21 and determines the switch inserting location from the analysis result 2301 of the obtained candidate block (step 2302).

Then the first countermeasure step inserts a switch in the power line (step 2303) in accordance with the determination in the step 2302, and executes EMS analysis 2304 again.

In the EMS analysis step 2304, it is analyzed whether noise countermeasures have been attained (step 2305).

In case noises have not been removed after the first countermeasure is taken, execution may return to step 2302 to repeat the first countermeasure, or execution may proceed to the second countermeasure step.

Insertion of an LC filter is described as the second countermeasure.

Figure 26:
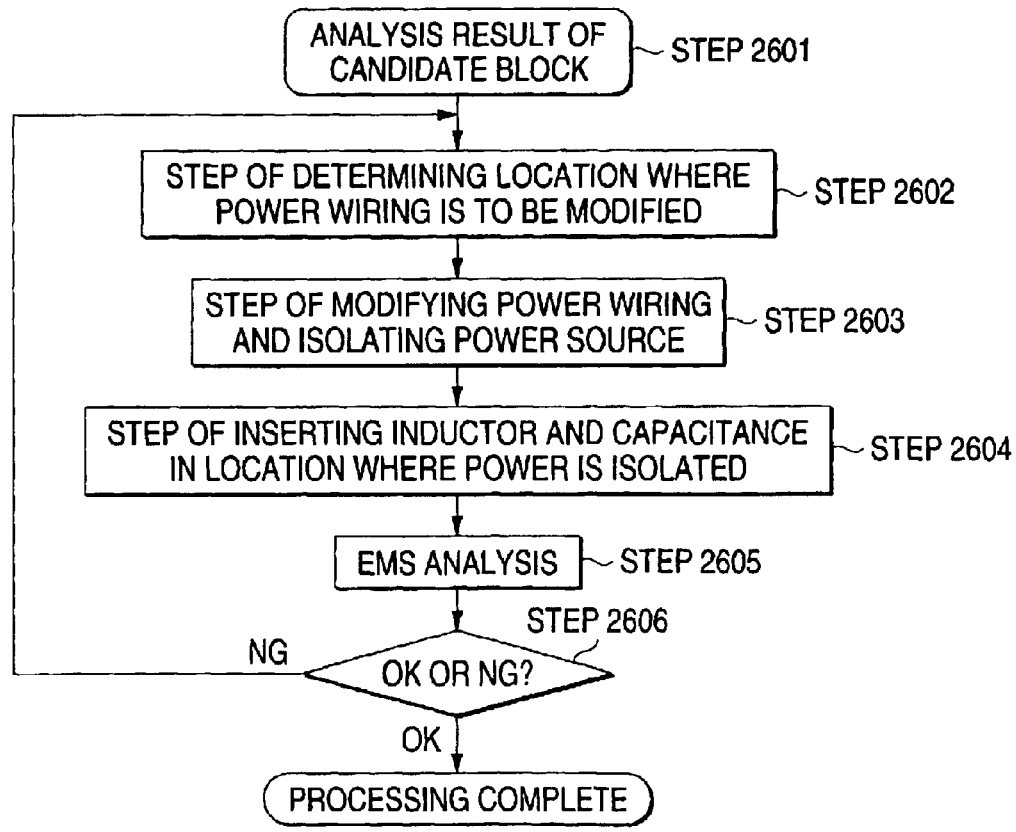
FIG. 26 shows the sixth embodiment of the invention.

In case noises remain in the EMS analysis step in the first countermeasure processing and execution proceeds to the second countermeasure step, LC filter insertion is executed as shown in FIG. 26.

Figure 27:
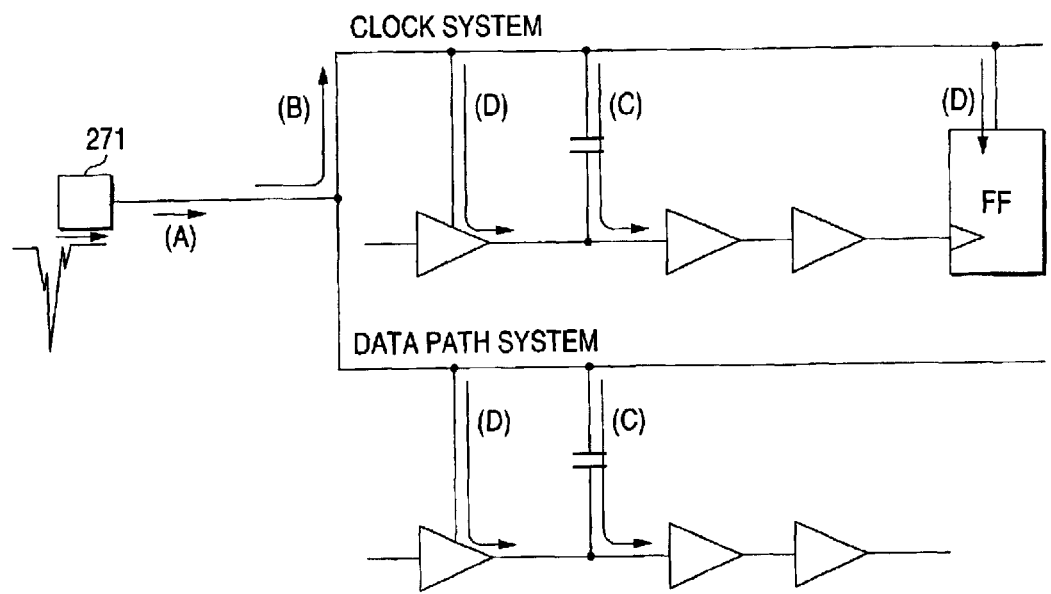
FIG. 27 shows the sixth embodiment of the invention.
Figure 28:
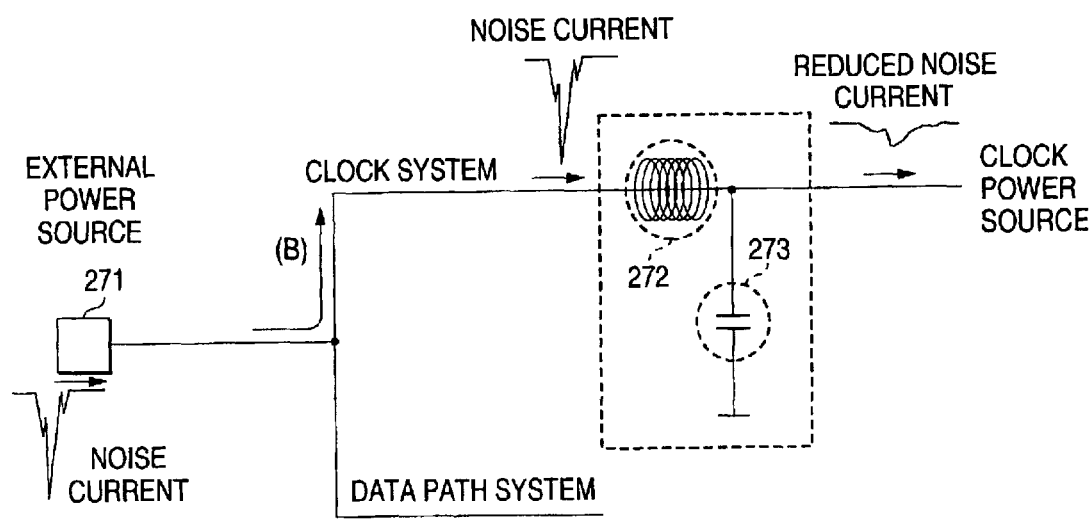
FIG. 28 shows the sixth embodiment of the invention.

Based on the analysis result 2601 obtained in the EMS analysis step 2305, a step of changing the power wiring between the power pad 271 and the internal power source to isolate the power source as shown in FIG. 27 and a step of inserting an LC filter between the power pad 271 and the internal power source as shown in FIG. 28 are sequentially executed. Isolation of the power source is performed so that the sections susceptible to an external noise or section that need EMS countermeasures are isolated from the sections resistant to an external noise or sections that requires no EMS countermeasures, based on the EMS analysis result. In this embodiment, isolating the power line of a clock system or a data path system allows the minimum number of LC filters to be arranged in target locations. With this configuration, it is possible to suppress an excessive increase in the area due to EMS countermeasures while arranging the minimum number of LC filters in target locations.

As shown in FIG. 28, an LC filter including an inductor 272 and a capacitance 273 is inserted in the power line thus isolated.

Actual processing used in case the second countermeasure is taken will be described.

The second countermeasure step, as shown in FIG. 26, extracts candidate blocks based on the analysis result of the EMS countermeasure step 2304 of the first countermeasure step. Sections where power wiring is modified are determined from the analysis result of the candidate block obtained (step 2602).

The power wiring in the section is modified and power source is isolated in accordance with the determination in the step 2602 (step 2603). An inductor and a capacitance are inserted to form an LC filter in the section where the power source is isolated (step 2604).

The EMS analysis step 2605 is executed again.

In the EMS analysis step 2605, it is determined whether EMS countermeasures have been attained (step 2606). In case EMS countermeasures have been attained, the procedure is complete.

In case not, execution returns to step 2602 and a series of processing is repeated beginning with the step of determining sections where the power wiring is to be modified in step 2602.

Alternatively, a step of reducing the power wiring length is executed as the third countermeasure.

Figure 29:
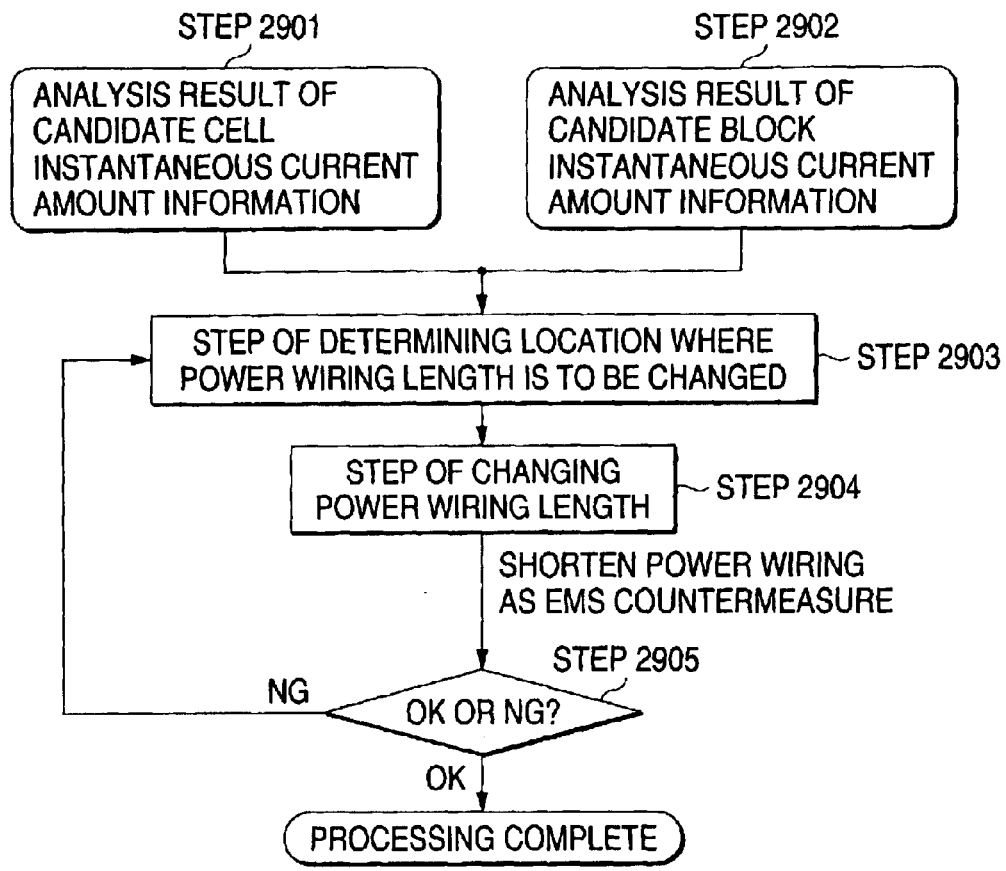
FIG. 29 shows the sixth embodiment of the invention.

The step, as shown in the flowchart of FIG. 29, extracts the candidate cells and candidate blocks based on the analysis result of the EMS countermeasure step 2605 and obtains the instantaneous current amount information as the analysis result of the candidate cells and instantaneous current amount information as the analysis result of the candidate cells, then determines the sections where power wiring length is to be changed based on this result (step 2903).

The power wiring length in the section is reduced in accordance with the determination in the step 2903 (step 2904). Then the EMS analysis step 2905 is executed again.

In the EMS analysis step, it is determined whether EMS countermeasures have been attained.

In case EMS countermeasures have been attained in the analysis step, the procedure is complete.

In case not, execution returns to step 2903 and a series of processing is repeated beginning with the step of determining sections where the power wiring length is to be changed.

Figure 30:
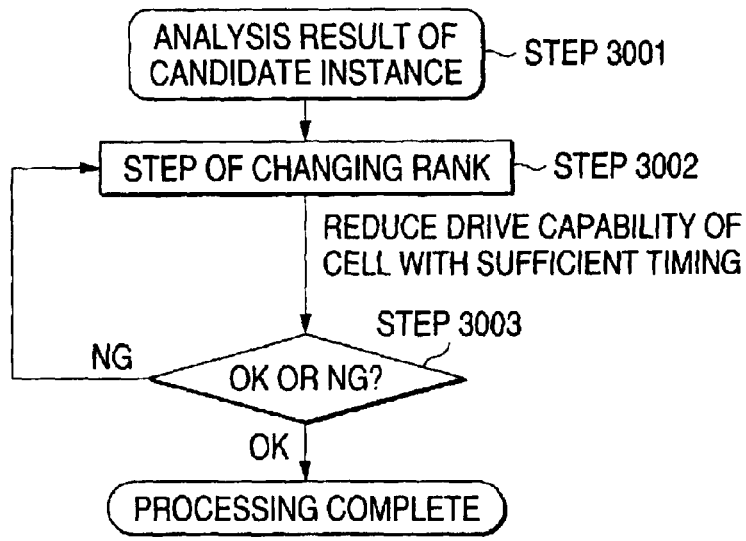
FIG. 30 shows the sixth embodiment of the invention.

Alternatively, a step of changing the cell rank is executed as the fourth countermeasure, as shown in FIG. 30 The step, as shown in the flowchart of FIG. 30, extracts the candidate instances based on the analysis result of the EMS countermeasure step 2905 and changes the cell rank in order to reduce the drive capability of a cell with sufficient timing (step 3002) based on the analysis result of the candidate instances thus obtained. The EMS analysis 3003 is executed again on the candidate instances after change.

In the EMS analysis step 3003, it is determined whether EMS countermeasures have been attained.

In case EMS countermeasures have been attained in the analysis step, the procedure is complete.

In case not, execution returns to step 3002 and a series of processing is repeated beginning with the step of changing the cell rank.

In this way, favorable EMS countermeasures are taken and the layout structure of a reliable semiconductor integrated circuit is provided automatically and at a high speed.

A semiconductor integrated circuit is manufactured in accordance with the layout thus obtained. It is possible to obtain a highly reliable semiconductor integrated circuit free from EMS.

While EMS analysis and corresponding countermeasures are executed in this way, it is possible to sequentially display the aforementioned steps and which countermeasures should be taken on which objects as well as what change will accompany the countermeasures. This allows countermeasures to be executed more efficiently.

Figure 31:
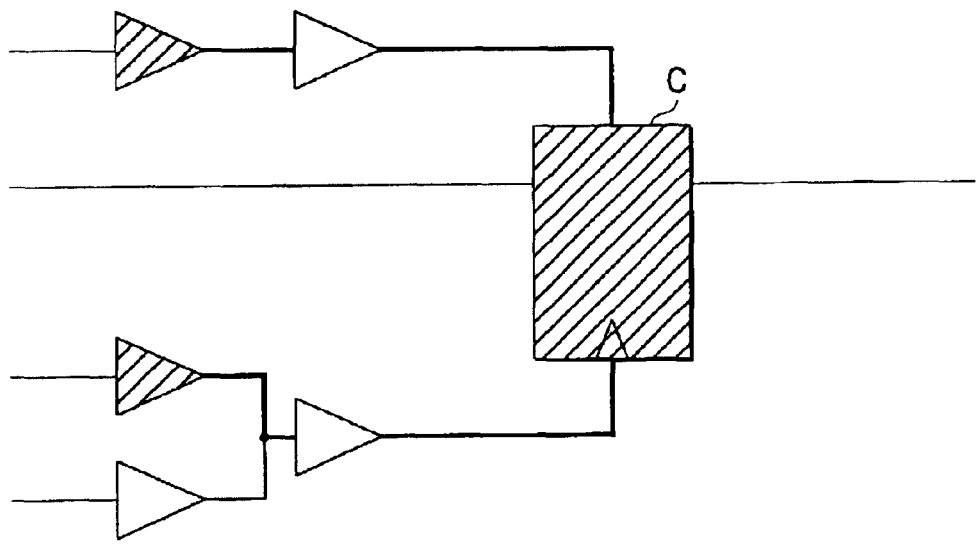
FIG. 31 shows the sixth embodiment of the invention.

The display method may be a highlighted display of sections where noise problems may occur and displaying the propagation paths in bold lines, as shown in cross-hatching in FIG. 31. This ensures favorable display and countermeasures.

Figure 32:
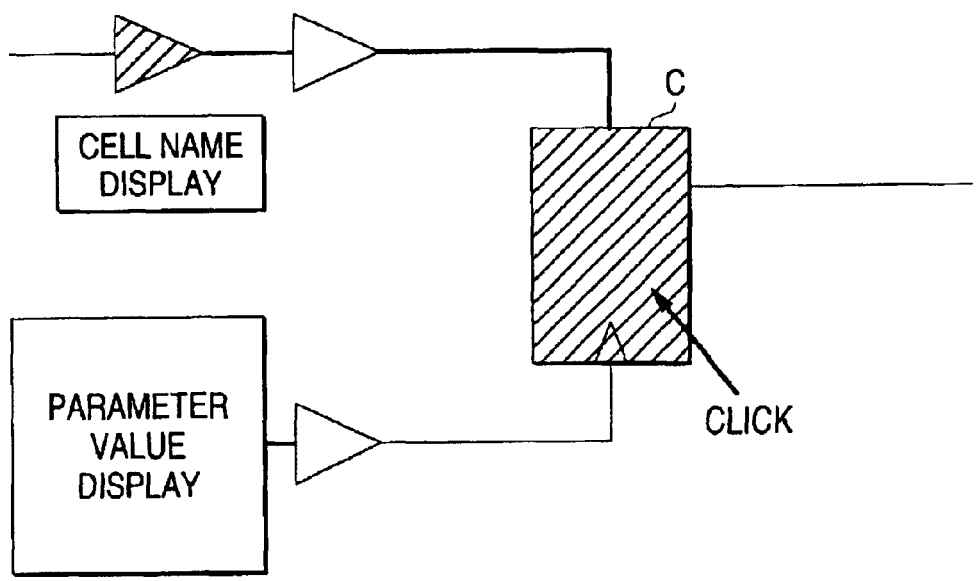
FIG. 32 shows the sixth embodiment of the invention.

As shown in FIG. 32, a click on Cell C may display the cell name of a cell most susceptible to a noise on the propagation path to the cell as well as highlight the cell.

Figure 33:
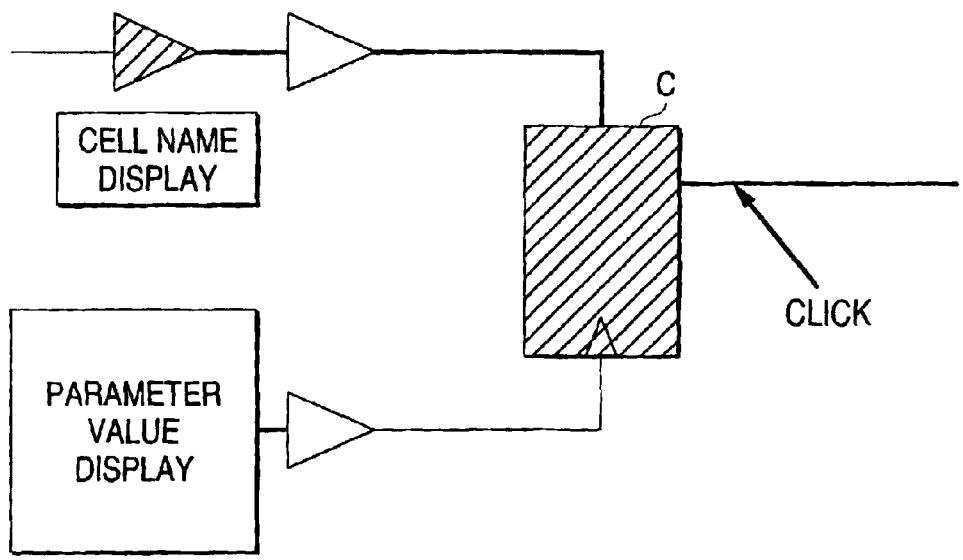
FIG. 33 shows the sixth embodiment of the invention.

As shown in FIG. 33, a click on a path may display the cell name of a cell most susceptible to a noise on the path as well as highlight the cell.

Figure 34:
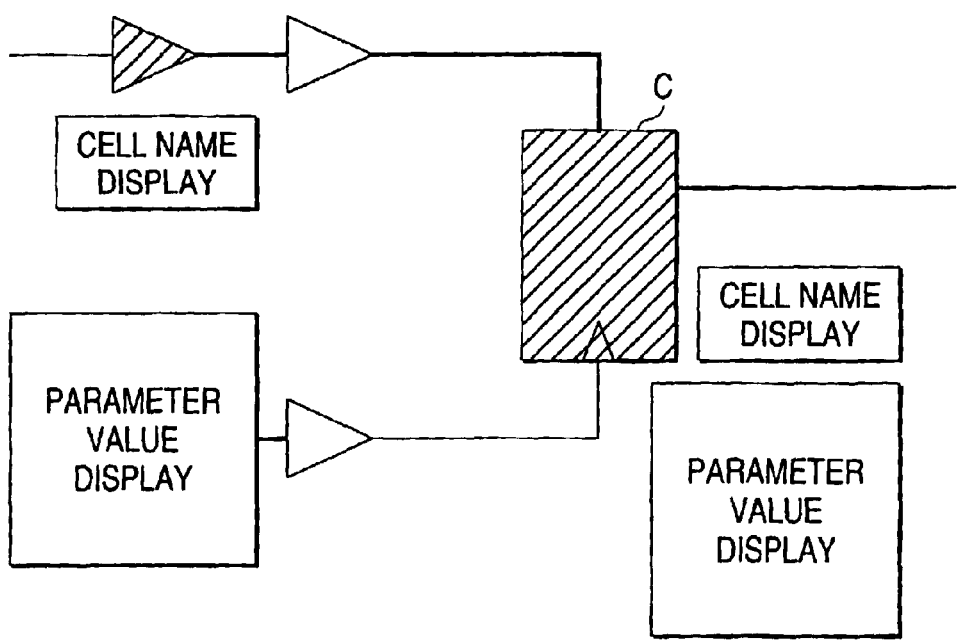
FIG. 34 shows the sixth embodiment of the invention.

As shown in FIG. 34, in case buffers are replaced for a cell susceptible to a noise, replacing the existing buffer with a high-powered buffer results in an increase in the power consumption. It is possible to propose the minimum change that is logically consistent as parameter display and cell name display shown in FIG. 31.

After such the virtual replacement, noise estimation is performed with respect to each transistor or cell, then power consumption information of the result of the noise estimation is reported. It can easily obtain the best layout via some processes. This method has a large effect, especially a circuit including many clock trees or register cells.

As mentioned earlier, at first, according to the invention, it is possible to identify a section susceptible to an external noise entering the power wiring of a semiconductor integrated circuit. This allows countermeasures before manufacturing the semiconductor integrated circuit thus improving the noise resistance.

Second, according to the invention, it is possible to obtain a change in the delay time at each circuit element assumed when a power noise has entered a semiconductor integrated device thereby detecting a circuit element where an unexpected circuit operation occurs due to such a change in the delay time. Thus it is possible to improve the resistance of the circuit to a power noise by improving the resistance of the circuit element to a noise. It is thus possible to evaluate through simulation the resistance to a power noise and take necessary countermeasures before manufacturing the semiconductor integrated circuit. This reduces the design period, reduces the development costs and brings the design nearer to perfection.

Third, according to the invention, blocks or instances that need countermeasures are sorted, and after the candidate for countermeasures are selected, various countermeasures are executed to perform analysis. This allows secured and reliable noise countermeasures to be taken in a short time.

Fourth, according to the invention, it is possible to determine the sections affected by a noise by providing a threshold library of noise propagation related to the power source. The invention focuses on the components such as register elements that may trigger circuit malfunction due to an EMS noise, and through analysis of such components, the invention restricts the candidate components for countermeasures.

A damage on the power consumption or timing caused by EMS countermeasures can be suppressed by analyzing the difference between the propagated noise amount and the threshold as well as determining an influence of virtual replacement of components.

Processing is made while appropriate display is provided, such as highlight display of cells susceptible to a noise and paths connecting these. This readily allows efficient noise countermeasures.

What is claimed is:

1. An electromagnetic disturbance analysis method for analyzing an external noise to a semiconductor integrated circuit, said method comprising the steps of:
    an impedance extraction step of extracting impedance information on a power wiring in a target semiconductor integrated circuits, or the power wiring in the target semiconductor integrated circuit in combination with an external power wiring of the semiconductor integrated circuit;
    an equivalent circuit creating step of creating an equivalent circuit from said impedance information; and
    an analysis step of supplying a noise waveform externally to said equivalent circuit as input information and analyzing the effect of the noise on said equivalent circuit so as to estimate the influence of the noise on said semiconductor integrated circuit.

2. The electromagnetic disturbance analysis method according to claim 1, wherein said analysis step includes:
    a noise waveform supplying step of supplying a start point power noise waveform;
    a power noise waveform calculating step of obtaining power noise waveforms at the internal node points and terminals in said semiconductor integrated circuit; and
    an error section detecting step of obtaining the influence of an external noise on the semiconductor integrated circuit and detecting sections susceptible to an external noise entering said semiconductor integrated circuit.

3. The electromagnetic disturbance analysis method according to claim 1,
    wherein said equivalent circuit creating step comprises: a functional block power equivalent circuit creating step of creating a degenerate impedance circuit of each functional block in a semiconductor integrated circuit from said impedance information; and an inter-block power equivalent circuit creating step of creating a circuit for analyzing the inter-block power wiring in the semiconductor integrated circuit from said impedance information,
    wherein said analysis step uses as said equivalent circuit at least one of said degenerate impedance circuit and said circuit for analyzing the inter-block power wiring.

4. The electromagnetic disturbance analysis method according to claim 1,
    wherein said equivalent circuit creating step comprises: a functional block power equivalent circuit creating step of creating a degenerate impedance circuit of each functional block in a semiconductor integrated circuit from said impedance information; and an inter-block power equivalent circuit creating step of creating a circuit for analyzing the inter-block power wiring in the semiconductor integrated circuit from said impedance information and an external power equivalent circuit creating step of creating an a circuit for analyzing the power wiring external to the semiconductor integrated circuit from said impedance information,
    wherein said analysis step uses as said equivalent circuit at least one of said degenerate impedance circuit, said circuit for analyzing the inter-block power wiring and said circuit for analyzing the power wiring external to the semiconductor integrated circuit.

5. The electromagnetic disturbance analysis method according to claim 3,
    wherein said inter-block power equivalent circuit creating step is a step of creating said circuit for analyzing the inter-block power wiring by adding the impedance information on said inter-block power wiring to said degenerate impedance circuit created by said functional block power equivalent circuit creating step,
    wherein said analysis step uses as said equivalent circuit at least one of said degenerate impedance circuit and said circuit for analyzing the inter-block power wiring.

6. The electromagnetic disturbance analysis method according to claim 4,
    wherein said inter-block power equivalent circuit creating step is a step of creating said circuit for analyzing the inter-block power wiring by adding the impedance information on said inter-block power wiring to said degenerate impedance circuit created by said functional block power equivalent circuit creating step,
    wherein said external power equivalent circuit creating step is a step of configuring a circuit for analyzing the power wiring external to the semiconductor integrated circuit by creating a degenerate impedance circuit in said circuit for analyzing the inter-block power wiring and adding the impedance information external to the semiconductor integrated circuit to said degenerate impedance circuit, wherein said analysis step uses as said equivalent circuit at least one of said degenerate impedance circuit, said circuit for analyzing the inter-block power wiring and said circuit for analyzing the power wiring external to the semiconductor integrated circuit.

7. The electromagnetic disturbance analysis method according to claim 2, wherein said noise waveform supplying step is a step of supplying a start point power noise waveform to the power terminal in a circuit for analyzing the inter-block power wiring created from said impedance information, wherein said power noise waveform calculating step comprises: an inter-block power noise calculating step of obtaining an inter-block power noise waveform at each internal node point in said circuit for analyzing the inter-block power wiring as well as obtaining a block terminal power noise waveform at a terminal in each functional block; and an intra-functional-block power noise waveform calculating step of obtaining a functional block power noise waveform at each node point in said functional block as well as obtaining an element terminal power noise waveform at the power terminal in each element by providing as input said block terminal power noise waveform to the impedance circuit in the functional block created from said impedance information, wherein the circuit section expected to be susceptible to an external noise by using at least one of said block terminal power noise waveform, said inter-block power noise waveform, said functional block power noise waveform and said element terminal power noise waveform is identified.

8. The electromagnetic disturbance analysis method according to claim 2, wherein said noise waveform supplying step is a step of supplying a start point power noise waveform to the power terminal in a circuit for analyzing the power wiring external to the semiconductor integrated circuit created from said impedance information, wherein said power noise waveform calculating step comprises: external power noise waveform calculating step of obtaining a terminal power noise waveform at the power terminal in a circuit for analyzing the inter-block power wiring created from said impedance information through said circuit for analyzing the power wiring external to the semiconductor integrated circuit; an inter-block power noise calculating step of obtaining an inter-block power noise waveform at each internal node point of said inter-block power wiring as well as obtaining a block terminal power noise waveform at a terminal in each functional block; and an intra-functional-block power noise waveform calculating step of obtaining a functional block power noise waveform at each node point in said functional block as well as obtaining an element terminal power noise waveform at the power terminal of each element by providing as input said block terminal power noise waveform to the impedance circuit in the functional block wherein the circuit section expected to be susceptible to an external noise by using at least one of said terminal power noise waveform, said block terminal power noise waveform, said inter-block power noise waveform, said functional block power noise waveform and said element terminal power noise waveform is identified.

9. The electromagnetic disturbance analysis method according to claim 2, wherein said error section detecting step comprises an error check step of identifying the circuit sections that will cause an error due to an external noise by providing a power noise peak threshold for said power noise waveform and assuming an error when said threshold is exceeded thus performing an error check.

10. The electromagnetic disturbance analysis method according to claim 8, wherein said error section detecting step performs a noise check step of performing a noise check by providing a threshold at the power terminal in said circuit for analyzing the inter-block power wiring and assuming an error when said threshold is exceeded and performs said inter-block power noise waveform calculating step only when an error is determined.

11. The electromagnetic disturbance analysis method according to claim 10, wherein the threshold at the power terminal in the circuit for analyzing the inter-block power wiring is the maximum among the thresholds for the terminal in the functional block in said semiconductor integrated circuit and inter-block power wiring.

12. The electromagnetic disturbance analysis method according to claim 7, wherein said error section detecting step performs a noise check step of performing a noise check by providing a peak threshold for a power noise at each functional block in a semiconductor integrated circuit and assuming an error when said threshold is exceeded at the power terminal in said functional block and performs said intra-functional-block power noise waveform calculating step only when an error is determined.

13. The electromagnetic disturbance analysis method according to claim 12, wherein the threshold for a power noise at the power terminal in each functional block is the maximum of the thresholds for the functional elements in each functional block and power wiring.

14. The electromagnetic disturbance analysis method according to claim 9, wherein said error check step comprises a noise check step of performing a noise check by providing a peak threshold for a power noise at each functional element in a semiconductor integrated circuit and assuming an error when the power noise peak value has exceeded said threshold.

15. The electromagnetic disturbance analysis method according to claim 9, wherein said error check step comprises a noise check step of performing a noise check by providing a peak threshold for a power noise determined by the distance to an adjacent signal line and length of parallel wiring for the power wiring in each functional block or inter-block power wiring and assuming an error when the power noise peak value has exceeded said threshold at each internal node points of said power wiring.

16. The electromagnetic disturbance analysis method according to claims 1 further comprising a display step of highlighting cells susceptible to a noise and paths connecting the cells as analyzed in said analysis step.

17. The electromagnetic disturbance analysis method according to claim 1 further comprising a display step of highlighting register cells such as memory cells.

18. The electromagnetic disturbance analysis method according to claim 1 further comprising a display step of displaying information on cells having been found susceptible to a noise and should be replaced in said analysis step.

19. The electromagnetic disturbance analysis method according to claim 1 further comprising a virtual display step of displaying parameters renewed for each cell virtually changed based on the information on cells that were analyzed to be replaced with spare in said analysis step.

20. The electromagnetic disturbance analysis method according to claim 1 further comprises a sorting step of sorting blocks or instances determined requiring countermeasures in said analysis step.

21. The electromagnetic disturbance analysis method according to claim 8, wherein said error section detecting step performs a noise check step of performing a noise check by providing a peak threshold for a power noise at each functional block in a semiconductor integrated circuit and assuming an error when said threshold is exceeded at the power terminal in said functional block and performs said intra-functional-block power noise waveform calculating step only when an error is determined.

22. The electromagnetic disturbance analysis method according to claim 21, wherein the threshold for a power noise at the power terminal in each functional block is the maximum of the thresholds for the functional elements in each functional block and power wiring.

23. An electromagnetic disturbance analysis apparatus comprising:
   an extraction unit for extracting impedance information on a power wiring in a target semiconductor integrated circuits, or the power wiring in the target semiconductor integrated circuit in the combination with an external power wiring of the semiconductor integrated circuit;
   an equivalent circuit creating unit for creating an equivalent circuit from said impedance information; and
   an analysis unit for supplying a noise waveform externally to said equivalent circuit as input information and for analyzing the effect of the noise on said equivalent circuit so as to estimate the influence of the noise on said semiconductor integrated circuit.

24. The electromagnetic disturbance analysis method according to claim 1, wherein said analysis step comprises:
   a step of obtaining a power waveform at the power terminal of each circuit element in said semiconductor integrated circuit;
   a calculating step of calculating the delay time of said circuit element based on the power waveform at the power terminal of said circuit element; and
   a timing verification step of determining whether the delay time of said circuit element is within an allowable range.

25. The electromagnetic disturbance analysis method according to claim 1, wherein said analysis step comprises:
   a step of obtaining a power waveform at the power terminal of each circuit element in said semiconductor integrated circuit;
   a calculating step of calculating the delay time of said circuit element based on the power waveform at the power terminal of said circuit element; and
   a timing verification step of determining whether the sum of the delay times of said series of circuit elements is within an allowable range.

26. The electromagnetic disturbance analysis method according to claim 24,
   wherein said analysis step further comprises a database creating step of calculating the variation amount in the delay time of a circuit element obtained when at least one of the input timing and peak value of the noise waveform of said power terminal is varied and creating a delay variation amount database based on the calculation result,
   wherein said calculating step comprises a step of obtaining the variation amount of the delay time of said circuit element with respect to a desired noise waveform from said delay variation amount database.

27. The electromagnetic disturbance analysis method according to claim 24, wherein said analysis step further comprises a database creating step of calculating the variation amount in the delay time of a circuit element obtained when at least one of the input timing and peak value of the noise waveform of said power terminal is varied and creating a delay variation rate database by obtaining the calculation result as a rate to the delay time of the circuit element observed when no power noises are present,
   wherein said calculating step comprises a step of obtaining the delay variation amount of the circuit element with respect to a desired noise, by multiplying the delay time of the circuit element observed when no power noises are present by said rate read from said delay variation rate database.

28. The electromagnetic disturbance analysis method according to claim 25,
   wherein said analysis step comprises a step of obtaining the delay variation amount of said series of circuit elements with the timing the power noise where the variation amount of each circuit element is the maximum is input to said series of circuit element, as the maximum delay amount of said series of circuit elements.

29. The electromagnetic disturbance analysis method according to claim 1, wherein said analysis step comprises a step of detecting a circuit section where a signal does not arrive within a time required for proper circuit operation due to a variation in the delay time of a circuit element caused by a power noise thus resulting in an unexpected circuit operation.

30. The electromagnetic disturbance analysis method according to claim 29 further comprises an error element detecting step of exploring a circuit element whose delay time is most affected by a power noise from said detected circuit section and detecting the circuit element as an error element.

31. The electromagnetic disturbance analysis method according to claim 30 further comprises a reinforcing step of taking power noise hardening countermeasures on said error element.

32. The electromagnetic disturbance analysis method according to claim 30 further comprises a replacing step of replacing the circuit element assumed as an error element in said error element detecting step with a circuit element whose delay variation amount with respect to a power noise is smaller.

33. The electromagnetic disturbance analysis method according to claim 30 further comprises a replacing step of replacing the circuit element assumed as an error element in said error element detecting step with a circuit element which satisfies a constraint time.

34. The electromagnetic disturbance analysis method according to claim 25,
   wherein said analysis step further comprises a database creating step of calculating the variation amount in the delay time of a circuit element obtained when at least one of the input timing and peak value of the noise waveform of said power terminal is varied and creating a delay variation amount database based on the calculation result,
   wherein said calculating step comprises a step of obtaining the variation amount of the delay time of said circuit element with respect to a desired noise waveform from said delay variation amount database.

35. The electromagnetic disturbance analysis method according to claim 25, wherein said analysis step further comprises a database creating step of calculating the variation amount in the delay time of a circuit element obtained when at least one of the input timing and peak value of the noise waveform of said power terminal is varied and creating a delay variation rate database by obtaining the calculation result as a rate to the delay time of the circuit element observed when no power noises are present, wherein said calculating step comprises a step of obtaining the delay variation amount of the circuit element with respect to a desired noise, by multiplying the delay time of the circuit element observed when no power noises are present by said rate read from said delay variation rate database.

36. The semiconductor device manufacturing method comprises a step of manufacturing a semiconductor device through error-free layout design based on the analysis result using an electromagnetic disturbance analysis method, said electromagnetic disturbance analysis method comprising the steps of:

an impedance extraction step of extracting impedance information on a power wiring in a target semiconductor integrated circuit, or the power wiring in the target semiconductor integrated circuit in combination with an external power wiring of the semiconductor integrated circuit;

an equivalent circuit creating step of creating an equivalent circuit from said impedance information; and an analysis step of supplying a noise waveform externally to said equivalent circuit as an input information and analyzing the effect of the noise on said equivalent circuit so as to estimate the influence of the noise on said semiconductor integrated circuit.

37. An electromagnetic disturbance analysis method for analyzing an electromagnetic disturbance in an LSI circuit, said method comprising the steps of:

a library storage step of calculating a noise threshold that changes the output result or internal state of circuit elements caused by a power noise and storing the noise threshold into a library; and an analysis step of analyzing whether the output of each of the circuit elements in said LSI circuit becomes erroneous due to the power noise based on said noise threshold stored in said library.

38. The electromagnetic disturbance analysis method according to claim 37 wherein said library storage step comprises a step of storing into a library any of the peak, width and shape functions or values of the voltage or current waveform that can pass through a circuit element.

39. The electromagnetic disturbance analysis method according to claim 37, wherein said library storage step comprises a step of storing into said library a noise threshold for a path on which a noise is input to the terminal of a circuit element and is output from the terminal of the circuit element or a path for changing the internal state.

40. The electromagnetic disturbance analysis method according to claim 37, wherein said analysis step comprises a step of analyzing a path on which a noise is input to the terminal of a circuit element and is output from the terminal of the circuit element or a path for changing the internal state.

41. The electromagnetic disturbance analysis method according to claim 37, wherein said analysis step comprises a recording step of recording path information.

42. The electromagnetic disturbance analysis method according to claim 41, wherein said recording step comprises a step of recording a circuit element where a noise is propagated.

43. The electromagnetic disturbance analysis method according to claim 41, wherein said recording step comprises a step of recording a register element where a noise is propagated.

44. The electromagnetic disturbance analysis method according to claim 41, wherein said recording step comprises a step of recording a damage when a circuit element where a noise is propagated is virtually changed to a circuit element with different drive capability.

45. The electromagnetic disturbance analysis method according to claim 41, wherein said recording step comprises a step of recording a circuit element susceptible to a noise on the path.

46. The electromagnetic disturbance analysis method according to claim 37, wherein said analysis step comprises a step of calculating said power noise analyzing electromagnetic wave.

47. The electromagnetic disturbance analysis method according to claim 37, wherein said analysis step comprises a step of recording a circuit element susceptible to a noise on the path entering a specified circuit element.

48. The electromagnetic disturbance analysis method according to claim 37, wherein said analysis step comprises a step of recording a circuit element susceptible to a noise on the path entering a register element.

49. An electromagnetic disturbance analysis apparatus for analyzing an electromagnetic disturbance in an LSI circuit comprising:

a library for storing the noise threshold that changes the output result or internal state of circuit elements caused by a power noise and storing the noise threshold into a library; and an analysis unit which analyses whether the output of each of the circuit elements in said LSI circuit becomes erroneous due to the power noise based on said noise threshold stored in said library.

50. An electromagnetic disturbance countermeasure method comprising:

a step of analyzing an electromagnetic disturbance in an LSI circuit so as to identify blocks and instances that are affected by said electromagnetic disturbance;

a sorting step of sorting said blocks or said instances that need countermeasures based on said analyzing result; and a countermeasure step of taking countermeasures to minimize a power noise on each block or instance in accordance with the order arranged by said sorting step.

51. The electromagnetic disturbance analysis method according to claim 50, further comprising a step of analyzing EMS of the block or instance after said countermeasure step, wherein said countermeasure step and analysis step are repeated until the influence of the power noise is found below a predetermined value in said analysis step.

52. The electromagnetic disturbance analysis method according to claim 51, wherein said countermeasure step is a step of inserting a delay adjustment element for performing delay adjustment so that a switching element will become highly resistant with the timing a current including a noise enters the switching element and an RC filter circuit formed by said switching element and a capacitance element.

53. The electromagnetic disturbance analysis method according to claim 51, wherein said countermeasure step is a step of inserting an inductor.

54. The electromagnetic disturbance analysis method according to claim 51, wherein said countermeasure step is a step of adjusting the power wiring length distance.

55. The electromagnetic disturbance analysis method according to claim 51, wherein said countermeasure step is a step of changing the cell rank so that the drive capability of the cell with sufficient timing will be reduced.

56. The electromagnetic disturbance analysis method according to claim 50 further comprising a countermeasure sorting step of sorting countermeasures to take on blocks or instances determined to require countermeasures in said analysis step.

57. An electromagnetic disturbance countermeasure apparatus comprising:

a unit for analyzing an electromagnetic disturbance in an LSI circuit so as to identify blocks and instances that are affected by said electromagnetic disturbance;

a sorting unit for sorting said blocks or said instances that need countermeasures based on said analyzing result; and a countermeasure unit for taking countermeasures to minimize a power noise on each block or instance in accordance with the order arranged by said sorting unit.

58. The electromagnetic disturbance countermeasure apparatus according to claim 57 further comprising unit for analyzing EMS of the block or instance that undertook countermeasures in said countermeasure unit, wherein said countermeasure step and analysis step are repeated until the influence of the power noise is found below a predetermined value in said analysis step.

\* \* \* \* \*